(12) United States Patent  
Becze et al.

(10) Patent No.: US 9,013,867 B2  
(45) Date of Patent: Apr. 21, 2015

(54) HINGE FOR A HANDHELD COMPUTING DEVICE

(71) Applicant: Z124, Georgetown (KY)

(72) Inventors: Charles Becze, Oakville (CA); Michael J. O'Connor, Gurnee, IL (US)

(73) Assignee: Z124, George Town (KY)

( * ) Notice: Subject to any disclaimer, the term of this patent is extended or adjusted under 35 U.S.C. 154(b) by 47 days.

(21) Appl. No.: 13/627,816

(22) Filed: Sep. 26, 2012

(65) Prior Publication Data

US 2013/0083466 A1    Apr. 4, 2013

Related U.S. Application Data

(60) Provisional application No. 61/539,884, filed on Sep. 27, 2011.

(51) Int. Cl.
    *H05K 13/00*    (2006.01)
    *G06F 3/14*    (2006.01)
    (Continued)

(52) U.S. Cl.
CPC ............... *G06F 3/1423* (2013.01); *G09G 5/34* (2013.01); *H04M 1/0266* (2013.01); *G06F 1/1692* (2013.01); *G09G 5/00* (2013.01); *G06F 3/041* (2013.01); *G09G 1/00* (2013.01); *H05K 5/0226* (2013.01); *H05K 5/0017* (2013.01); *H05K 13/00* (2013.01); *H04N 5/44591* (2013.01); *G06F 1/1637* (2013.01); *H05K 7/02* (2013.01); *E05D 3/12* (2013.01); *G06F 1/1641* (2013.01); *G06F 1/1601* (2013.01); *H05K 13/046* (2013.01); *H05K 5/04* (2013.01); *H05K 7/1452* (2013.01); *B29D 11/00673* (2013.01); *G02B 6/0001* (2013.01); *G06F 3/01* (2013.01); *G06F 3/048* (2013.01); *G06F 3/04897* (2013.01); *G06F 3/0412* (2013.01); *G06T 3/00* (2013.01); *G06F 1/1616* (2013.01); *G06F 9/4443* (2013.01); *G06F 3/0481* (2013.01); *G06F 3/0483* (2013.01); *G06F 3/04883* (2013.01); *G06F 9/44* (2013.01); *G09G 5/14* (2013.01); *H04W 72/06* (2013.01); *H04W 88/06* (2013.01);

(Continued)

(58) Field of Classification Search
CPC ......... E05D 3/12; G06F 1/1641; H05K 13/00
USPC ........ 361/679.27, 679.01, 679.28; 455/575.1, 455/575.3
See application file for complete search history.

(56) References Cited

U.S. PATENT DOCUMENTS 4,427,006 A * 1/1984 Nottke ............................ 606/42
4,825,395 A * 4/1989 Kinser et al. ............. 361/679.09

(Continued)

OTHER PUBLICATIONS

"Google Image Result Fujitsu Dual Screen Phone," ComputerRiver, Oct. 7, 2010, [retrieved Apr. 18, 2011], 1 page. Retrieved from: www.google.com/imgres?imgurl=http://www.computerriver.com/images/dual-screen-phone.jpg.

(Continued)

*Primary Examiner* — Lisa Lea Edmonds
*Assistant Examiner* — Rashen E Morrison
(74) *Attorney, Agent, or Firm* — Sheridan Ross P.C.

(57) ABSTRACT

A handheld computing device may include a first screen having a first display, a second screen having a second display, and a hinge connected to the first and second screens. The hinge may include a plurality of axes to enable the first and second screens to rotate about distinct axes. The hinge may include a hub having an internal passage configured to electrically couple the first and second screens.

27 Claims, 43 Drawing Sheets

(51) Int. Cl.

| | | |
|---|---|---|
| G09G 5/34 | (2006.01) | |
| H04M 1/02 | (2006.01) | |
| G06F 1/16 | (2006.01) | |
| G09G 5/00 | (2006.01) | |
| G06F 3/041 | (2006.01) | |
| G09G 1/00 | (2006.01) | |
| H05K 5/02 | (2006.01) | |
| H05K 5/00 | (2006.01) | |
| H04N 5/445 | (2011.01) | |
| H05K 7/02 | (2006.01) | |
| E05D 3/12 | (2006.01) | |
| H05K 13/04 | (2006.01) | |
| H05K 5/04 | (2006.01) | |
| H05K 7/14 | (2006.01) | |
| B29D 11/00 | (2006.01) | |
| F21V 8/00 | (2006.01) | |
| G06F 3/01 | (2006.01) | |
| G06F 3/048 | (2013.01) | |
| G06F 3/0489 | (2013.01) | |
| G06T 3/00 | (2006.01) | |
| G06F 9/44 | (2006.01) | |
| G06F 3/0481 | (2013.01) | |
| G06F 3/0483 | (2013.01) | |
| G06F 3/0488 | (2013.01) | |
| G09G 5/14 | (2006.01) | |
| H04W 72/06 | (2009.01) | |
| H04W 88/06 | (2009.01) | |
| H04W 48/18 | (2009.01) | |

(52) U.S. Cl.
CPC ............ *G06F 3/1438* (2013.01); *G06F 3/1446* (2013.01); *H04W 48/18* (2013.01)

(56) References Cited

U.S. PATENT DOCUMENTS

| | | | |
|---|---|---|---|
| 4,961,126 A * | 10/1990 | Suzuki | 361/679.09 |
| 5,363,089 A * | 11/1994 | Goldenberg | 340/7.63 |
| 5,581,440 A * | 12/1996 | Toedter | 361/679.28 |
| 5,959,833 A | 9/1999 | Youens | |
| 6,195,264 B1 | 2/2001 | Lauffer et al. | |
| 6,223,393 B1 * | 5/2001 | Knopf | 16/366 |
| 6,239,976 B1 | 5/2001 | Templeton et al. | |
| 6,404,626 B1 | 6/2002 | Low et al. | |
| 6,504,710 B2 | 1/2003 | Sutton et al. | |
| 6,652,170 B1 * | 11/2003 | Arnold | 400/88 |
| 6,653,919 B2 | 11/2003 | Shih-Chung et al. | |
| 6,900,981 B2 * | 5/2005 | Kuivas et al. | 361/679.06 |
| 7,115,780 B2 * | 10/2006 | Barzaghi et al. | 564/308 |
| 7,140,074 B2 * | 11/2006 | Han et al. | 16/366 |
| 7,155,780 B2 * | 1/2007 | Chen | 16/326 |
| 7,274,954 B2 * | 9/2007 | Oldham | 455/575.3 |
| 7,330,548 B2 * | 2/2008 | Kim et al. | 379/433.12 |
| 7,355,137 B2 * | 4/2008 | Kawasaki et al. | 200/302.2 |
| D593,091 S | 5/2009 | Behar et al. | D14/371 |
| 7,554,050 B1 * | 6/2009 | Lv | 200/339 |
| 7,645,063 B2 | 1/2010 | Lee et al. | |
| 7,656,675 B2 * | 2/2010 | Kim et al. | 361/752 |
| 7,697,281 B2 | 4/2010 | Dabov et al. | |
| 7,832,056 B2 * | 11/2010 | Kuwajima et al. | 16/354 |
| 7,869,834 B2 * | 1/2011 | Seol et al. | 455/566 |
| 7,876,288 B1 | 1/2011 | Huang | |
| 7,889,139 B2 * | 2/2011 | Hobson et al. | 343/702 |
| 7,911,387 B2 * | 3/2011 | Hill et al. | 343/700 MS |
| 7,920,904 B2 * | 4/2011 | Kim et al. | 455/575.1 |
| 7,957,632 B2 * | 6/2011 | Yoshida et al. | 396/55 |
| 8,058,553 B2 | 11/2011 | Saito et al. | |
| 8,089,772 B2 * | 1/2012 | Chen | 361/752 |
| 8,194,001 B2 * | 6/2012 | Miller et al. | 345/1.3 |
| 8,232,493 B2 * | 7/2012 | Ichikawa et al. | 200/341 |
| 8,279,592 B2 * | 10/2012 | Imamura et al. | 361/679.27 |
| 8,284,568 B2 * | 10/2012 | Xiao | 361/810 |
| 8,373,975 B2 * | 2/2013 | Liang et al. | 361/679.02 |
| 8,395,555 B2 * | 3/2013 | Hobson et al. | 343/702 |
| 8,441,791 B2 * | 5/2013 | Bohn et al. | 361/679.55 |
| 8,451,601 B2 * | 5/2013 | Bohn et al. | 361/679.55 |
| 8,456,809 B2 * | 6/2013 | Kim et al. | 361/679.01 |
| 8,526,161 B2 * | 9/2013 | Weber et al. | 361/288 |
| 8,550,689 B2 | 10/2013 | Han et al. | |
| 8,553,397 B2 | 10/2013 | Alameh et al. | |
| 8,564,965 B2 | 10/2013 | Sloey et al. | |
| D693,323 S * | 11/2013 | Kawase et al. | D14/138 AB |
| 8,578,561 B2 * | 11/2013 | Chuang | 16/354 |
| 8,598,474 B2 * | 12/2013 | Chen | 200/1 B |
| 8,615,848 B2 * | 12/2013 | Mitsui | 16/366 |
| 8,624,844 B2 | 1/2014 | Behar et al. | |
| 8,626,252 B2 * | 1/2014 | Kim et al. | 455/575.1 |
| 8,681,056 B2 * | 3/2014 | Hobson et al. | 343/702 |
| 8,764,267 B2 | 7/2014 | Kim | |
| 8,787,016 B2 * | 7/2014 | Rothkopf et al. | 361/679.55 |
| 2001/0018799 A1 | 9/2001 | Lauffer et al. | |
| 2001/0055202 A1 | 12/2001 | Templeton et al. | |
| 2004/0207568 A1 * | 10/2004 | Ooshima et al. | 345/1.1 |
| 2004/0264118 A1 | 12/2004 | Karidis et al. | |
| 2005/0050686 A1 * | 3/2005 | Kurokawa | 16/354 |
| 2006/0186906 A1 | 8/2006 | Bottoms et al. | |
| 2007/0133156 A1 | 6/2007 | Ligtenberg et al. | |
| 2007/0242421 A1 * | 10/2007 | Goschin et al. | 361/681 |
| 2007/0298850 A1 | 12/2007 | Miyata et al. | |
| 2008/0062625 A1 * | 3/2008 | Batio | 361/680 |
| 2008/0076298 A1 | 3/2008 | Matsumura et al. | |
| 2008/0134468 A1 * | 6/2008 | Chen et al. | 16/340 |
| 2008/0278269 A1 | 11/2008 | Ramirez et al. | |
| 2009/0005132 A1 | 1/2009 | Ogatsu | |
| 2009/0049773 A1 | 2/2009 | Zadesky et al. | |
| 2009/0070961 A1 * | 3/2009 | Chung et al. | 16/354 |
| 2009/0103261 A1 | 4/2009 | Shih | |
| 2009/0256759 A1 * | 10/2009 | Hill et al. | 343/702 |
| 2009/0257207 A1 | 10/2009 | Wang et al. | |
| 2009/0278806 A1 | 11/2009 | Duarte et al. | |
| 2009/0282650 A1 * | 11/2009 | Jin et al. | 16/367 |
| 2009/0322790 A1 * | 12/2009 | Behar et al. | 345/659 |
| 2010/0053002 A1 | 3/2010 | Wojack et al. | |
| 2010/0053876 A1 | 3/2010 | Widmer et al. | |
| 2010/0066393 A1 | 3/2010 | Bottoms et al. | |
| 2010/0071159 A1 * | 3/2010 | Myung | 16/303 |
| 2010/0076583 A1 | 3/2010 | Wojack et al. | |
| 2010/0127726 A1 | 5/2010 | Abe et al. | |
| 2010/0162128 A1 | 6/2010 | Richardson et al. | |
| 2011/0043979 A1 | 2/2011 | Saito et al. | |
| 2011/0096481 A1 | 4/2011 | Ueno | |
| 2011/0117971 A1 | 5/2011 | Kim et al. | |
| 2011/0128216 A1 * | 6/2011 | Renwick | 345/156 |
| 2011/0138617 A1 | 6/2011 | Clayton et al. | |
| 2011/0216064 A1 | 9/2011 | Dahl et al. | |
| 2011/0235304 A1 | 9/2011 | Brown et al. | |
| 2011/0255259 A1 * | 10/2011 | Weber et al. | 361/807 |
| 2011/0310549 A1 | 12/2011 | Murakami | |
| 2012/0002360 A1 | 1/2012 | Seo et al. | |
| 2012/0020045 A1 | 1/2012 | Tanase | |
| 2012/0105487 A1 | 5/2012 | Son et al. | |
| 2012/0120627 A1 * | 5/2012 | O'Connor et al. | 361/807 |
| 2012/0147535 A1 * | 6/2012 | Ahn et al. | 361/679.01 |
| 2012/0149438 A1 * | 6/2012 | Kwon | 455/566 |
| 2012/0154288 A1 | 6/2012 | Walker | |
| 2012/0182677 A1 * | 7/2012 | Seo | 361/679.01 |
| 2012/0194448 A1 * | 8/2012 | Rothkopf | 345/173 |
| 2012/0206864 A1 * | 8/2012 | Bohn et al. | 361/679.01 |
| 2012/0206893 A1 * | 8/2012 | Bohn et al. | 361/807 |
| 2012/0257368 A1 * | 10/2012 | Bohn et al. | 361/809 |
| 2012/0309470 A1 | 12/2012 | Park et al. | |
| 2013/0014346 A1 * | 1/2013 | Ahn et al. | 16/354 |
| 2013/0016489 A1 * | 1/2013 | Yeh et al. | 361/807 |
| 2013/0021262 A1 | 1/2013 | Chen | |
| 2013/0076597 A1 | 3/2013 | Becze | |
| 2013/0077221 A1 | 3/2013 | Becze et al. | |
| 2013/0077236 A1 | 3/2013 | Becze et al. | |
| 2013/0082585 A1 | 4/2013 | Becze et al. | |
| 2013/0082955 A1 | 4/2013 | Becze et al. | |
| 2013/0083464 A1 | 4/2013 | Becze et al. | |

(56) References Cited

U.S. PATENT DOCUMENTS

| | | | |
|---|---|---|---|
| 2013/0083466 A1* | 4/2013 | Becze et al. | 361/679.27 |
| 2013/0083467 A1 | 4/2013 | Becze | |
| 2013/0083468 A1 | 4/2013 | Becze et al. | |
| 2013/0083469 A1 | 4/2013 | Becze et al. | |
| 2013/0083470 A1 | 4/2013 | Becze et al. | |
| 2013/0083477 A1 | 4/2013 | Becze et al. | |
| 2013/0083558 A1 | 4/2013 | Becze | |
| 2013/0088447 A1 | 4/2013 | Becze | |
| 2014/0001022 A1* | 1/2014 | Weber et al. | 200/513 |
| 2014/0069794 A1* | 3/2014 | Lin et al. | 200/529 |
| 2014/0307393 A1* | 10/2014 | Park et al. | 361/727 |

OTHER PUBLICATIONS

"Google Image Result for LG Dual Touch Screen Concept Phone by Eugene Kim," FGADGETS, Aug. 2010, [retrieved Apr. 18, 2011], 1 page. Retrieved from: www.google.com/imgres?imgurl=http://fgadgets.com/wp-content/uploads/2010/08/lg-dual-touch-screen-phone-Eugene-Kim-01.jpg.

"Google Image Result for Fujitsu Dual Screen Phone,"GSM DOME, Oct. 2010, [retrieved Apr. 18, 2011], 1 page. Retrieved from: www.google.com/imgres?imgurl=http://www.gsmdome.com/wp-content/uploads/2010/10/fujitsu-dual-screen-phone_w2cP7_54.jpg.

"Google Image Result for Kyocera Echo," Hardwaresphere, Feb. 2011, [retrieved Apr. 18, 2011], 1 page. Retrieved from: www.google.com/imgres?imgurl=http://www.hardwaresphere.com/wp-content/uploads/2011/02/kyocera-echo-dual-screen-android-phone-for-sprint-network.jpg.

"Google Image Result for HTC Triple Viper,"SantaFeMods, Apr. 2010, [retrieved Apr. 18, 2011], 1 page. Retrieved from:www.google.com/imgres?imgurl=http://www.santafemods.com/Forum/AndroidForums/htcTripleViper.png.

"Google Image Result for Dual-Screen Phone,"NetShet.org, Feb. 2011, [retrieved Apr. 18, 2011], 1 page. Retrieved from: www.google.com/imgres?imgurl=http://www.netshet.org/wp-content/uploads/2011/02/Dual-Scree . . .

"Kyocera Echo Hands-on," Engadget, © 2012, [Retrieved from the internet on Aug. 17, 2012 from <www.engadget.com/gallery/kyocera-echo-hands-on/#3855047>] 34 pages.

"Lexan* EXL resin," SABIC Innovative Plastics™, Jun. 2008, 24 pages, retrieved from [kbam.geampod.com/KBAM/Reflection/Assets/Thumbnail/10845_12.pdf].

Website entitled "Lapdock™ for Motorola ATRIX," Motorola Mobility, Inc, 2011, [retrieved on Apr. 18, 2011], 1 page. Retrieved from: www.motorola.com/Consumers/US-EN/Consumer-Product-and-Services/Mobile+Ph . . .

Website entitled "Motorola ATRIX 4G Laptop Dock Review," phoneArena.com, posted Mar. 2, 2011, [retrieved on Apr. 18, 2011], 6 pages. Retrieved from: www.phonearena.com/reviews/Motorola-ATRIX-4G-Laptop-Dock-Review_id2667.

Burns, C., "Motorola ATRIX 4G Laptop Dock Review," Android Community, Feb. 20, 2011, [retrieved on Apr. 18, 2011], 5 pages. Retrieved from: www.androidcommunity.com/motorola-atrix-4g-laptop-dock-review-20110220/.

Catacchio, "This smartphone has two huge screens . . . that rotate," The Next Web, Inc., Oct. 7, 2010, [retrieved on Jul. 21, 2011], 2 pages. Retrieved from: www.thenextweb.com/asia/2010/10/07/this-smartphone-has-two-huge-screens-that-rotate/.

Posted by Harman03, "Kyocera Echo Dual-screen Android Phone," posted 4 weeks from Apr. 18, 2011, [retrieved on Apr. 18, 2011], 3 pages. Retrieved from: www.unp.me/f106/kyocera-echo-dual-screen-android-phone-143800/.

Martin "Sony's new S2 tablet," clnet, Jul. 13, 2011, 2 pages, retrieved from [news.cnet.com/2300-1041_3-10008595-6.html?tag=mncol;txt].

Stein, S., "How does the Motorola Atrix 4G Lapdock compare with a laptop?" Crave—CNET, Feb. 9, 2011 [retrieved on Apr. 18, 2011], 7 pages. Retrieved from: www.news.cnet.com/8301-17938_105-20031251-1.html.

Official Action for U.S. Appl. No. 13/627,793, mailed May 15, 2014 10 pages.

Official Action for U.S. Appl. No. 13/628,378, mailed Jul. 22, 2014 10 pages.

Official Action for U.S. Appl. No. 13/628,419, mailed Apr. 29, 2014 10 pages.

Official Action for U.S. Appl. No. 13/628,436, mailed Apr. 18, 2014 12 pages.

Official Action for U.S. Appl. No. 13/629,291, mailed Aug. 11, 2014 15 pages.

Official Action for U.S. Appl. No. 13/629,030, mailed Oct. 6, 2014 10 pages.

Official Action for U.S. Appl. No. 13/627,769, mailed Jan. 16, 2015 11 pages.

Official Action for U.S. Appl. No. 13/627,793, mailed Mar. 3, 2015 26 pages.

Notice of Allowance for U.S. Appl. No. 13/628,378, mailed Mar. 2, 2015 8 pages.

Notice of Allowance for U.S. Appl. No. 13/628,436, mailed Feb. 17, 2015 10 pages.

Notice of Allowance for U.S. Appl. No. 13/629,291, mailed Jan. 12, 2015 10 pages.

Official Action for U.S. Appl. No. 13/629,068, mailed Dec. 31, 2014 17 pages.

Official Action for U.S. Appl. No. 13/628,987, mailed Jan. 27, 2015 10 pages.

* cited by examiner

|  | PORTRAIT ||||||  LANDSCAPE ||||||
|---|---|---|---|---|---|---|---|---|---|---|---|---|
|  | OPEN | CLOSED | EASEL | MODIFIED EASEL | PHONE | IMAGE/ VIDEO | OPEN | CLOSED | EASEL | MODIFIED EASEL | PHONE | IMAGE /VIDEO |
| P O R T R A I T | OPEN | X | HT | HT | HT | P | I | AT | HAT | HAT | HAT | P | I |
| | CLOSED | HT | X | HAT | HAT | P | I | HAT | AT | HAT | HAT | P | I |
| | EASEL | HT | HT | X | X | P | I | HAT | HAT | HAT | HAT | P | I |
| | PHONE | HT | X | HT | HT | X | I | HAT | HAT | HAT | HAT | X | I |
| | IMAGE/ VIDEO | HT | HT | HT | X | P | X | HAT | HAT | HAT | HAT | X | HAT |
| L A N D S C A P E | OPEN | AT | HAT | HAT | HAT | P | I | X | HT | HAT | HAT | P | I |
| | CLOSED | HAT | AT | HAT | HAT | P | I | HT | X | HAT | HAT | P | I |
| | EASEL | HAT | HAT | HAT | HAT | P | I | HT | HT | X | HAT | P | I |
| | MODIFIED EASEL | HAT | HAT | HAT | HAT | P | I | HT | HT | HAT | X | P | I |
| | IMAGE/ VIDEO | HAT | HAT | HAT | HAT | HAT | AT | HT | HT | HT | HAT | P | X |
| | DOCKED | | | | | | | | | | | | |

DOCKING SIGNAL

Key:
H - Hall Effect Sensor(s)
a - accelerometer(s)
T - Timer
P – communications Trigger
I – Image / Video capture Request

*FIG. 3B*

Tap

Long Press

Drag

Flick

Pinch

Spread

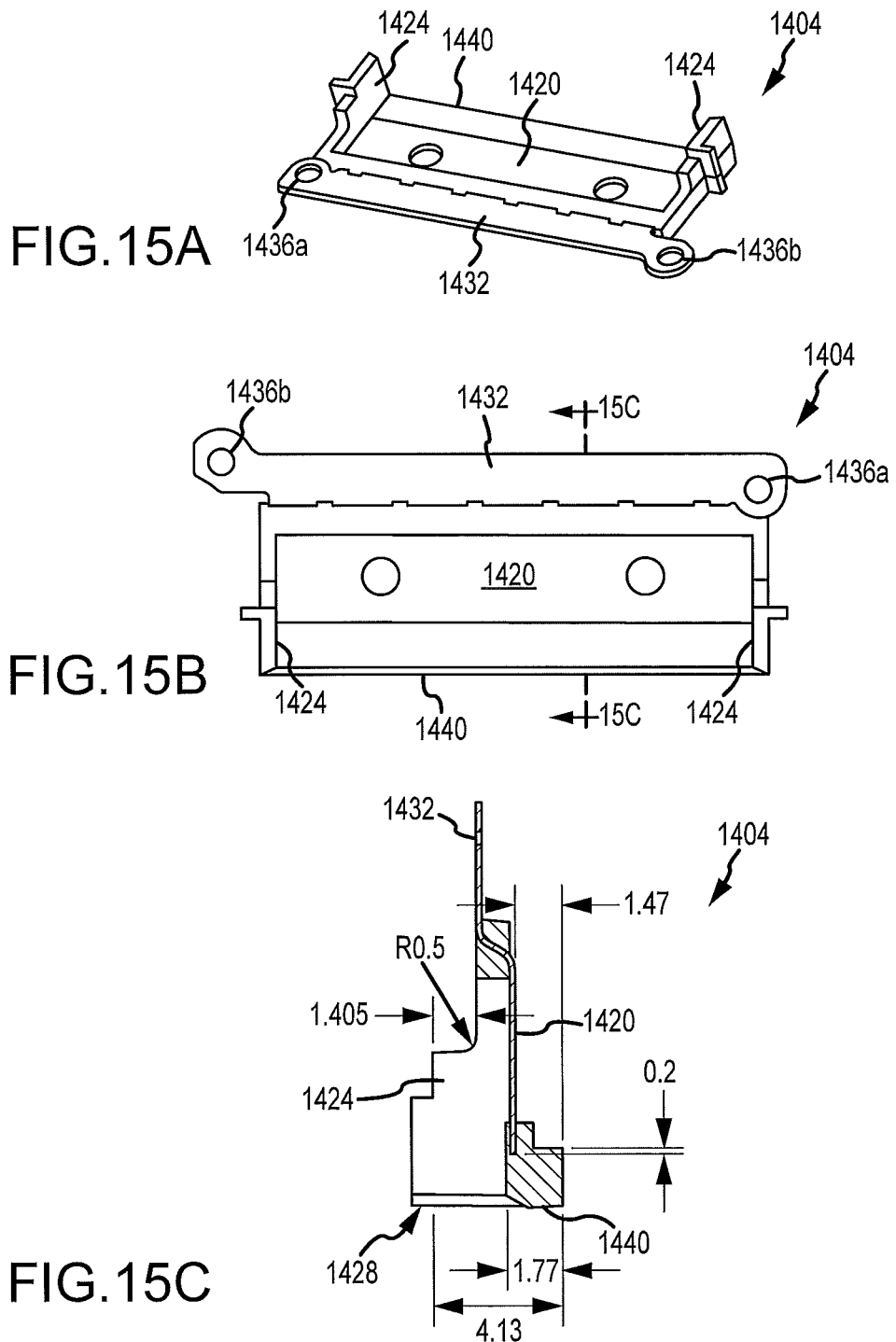

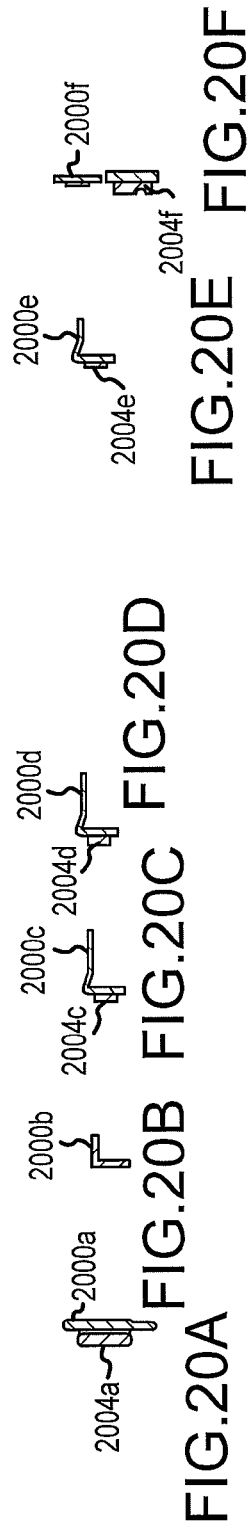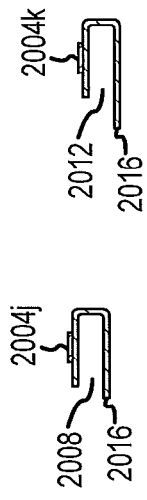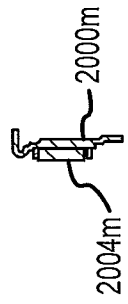

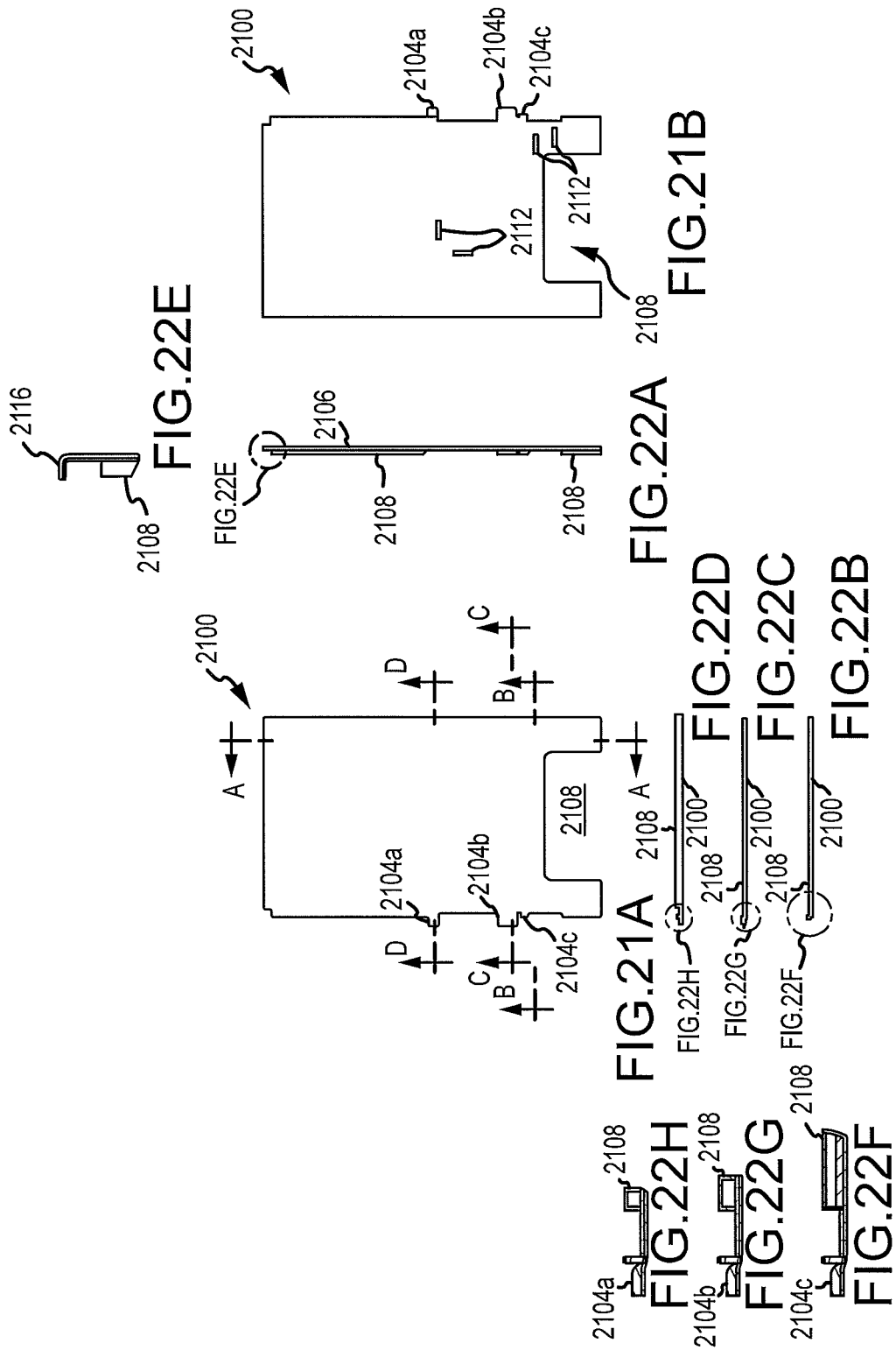

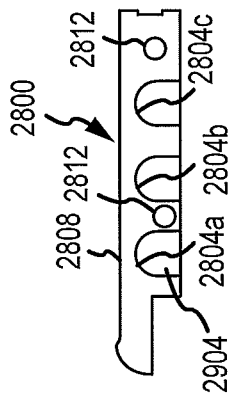
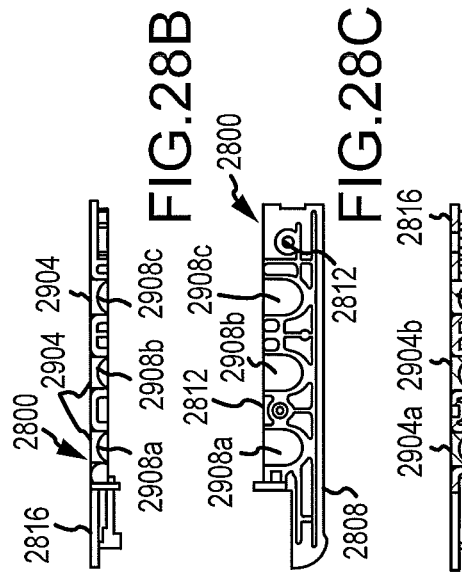
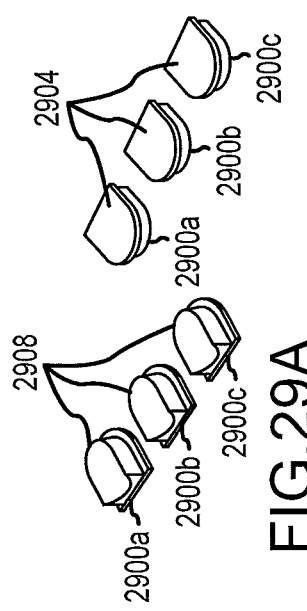

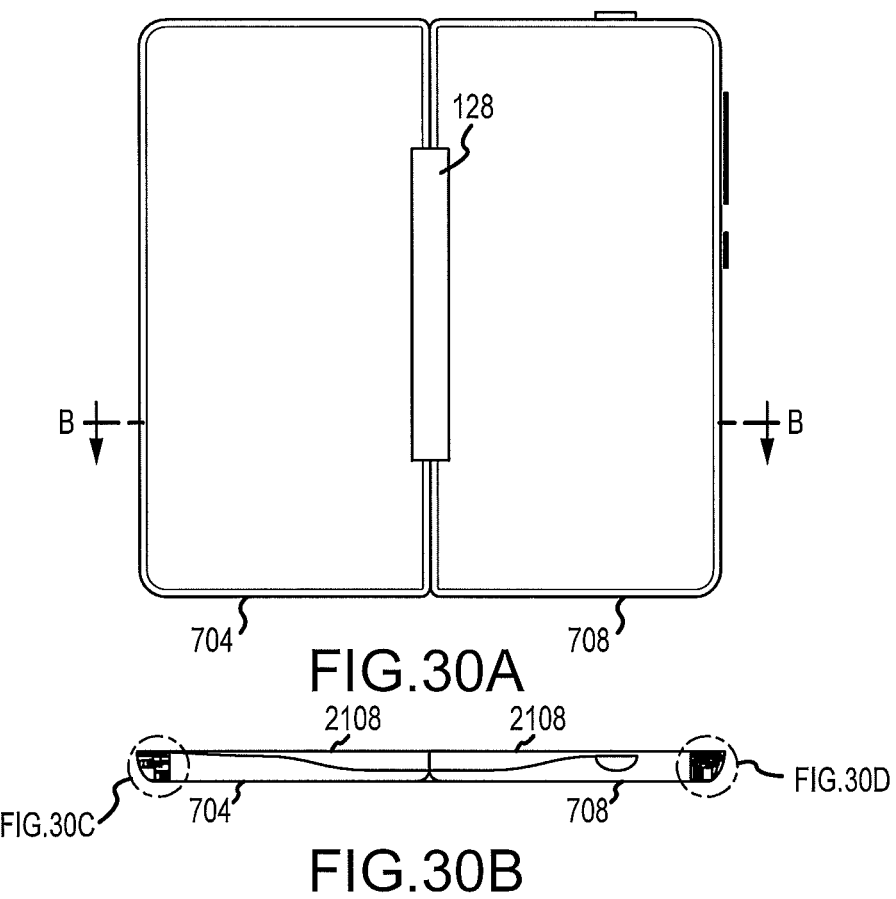

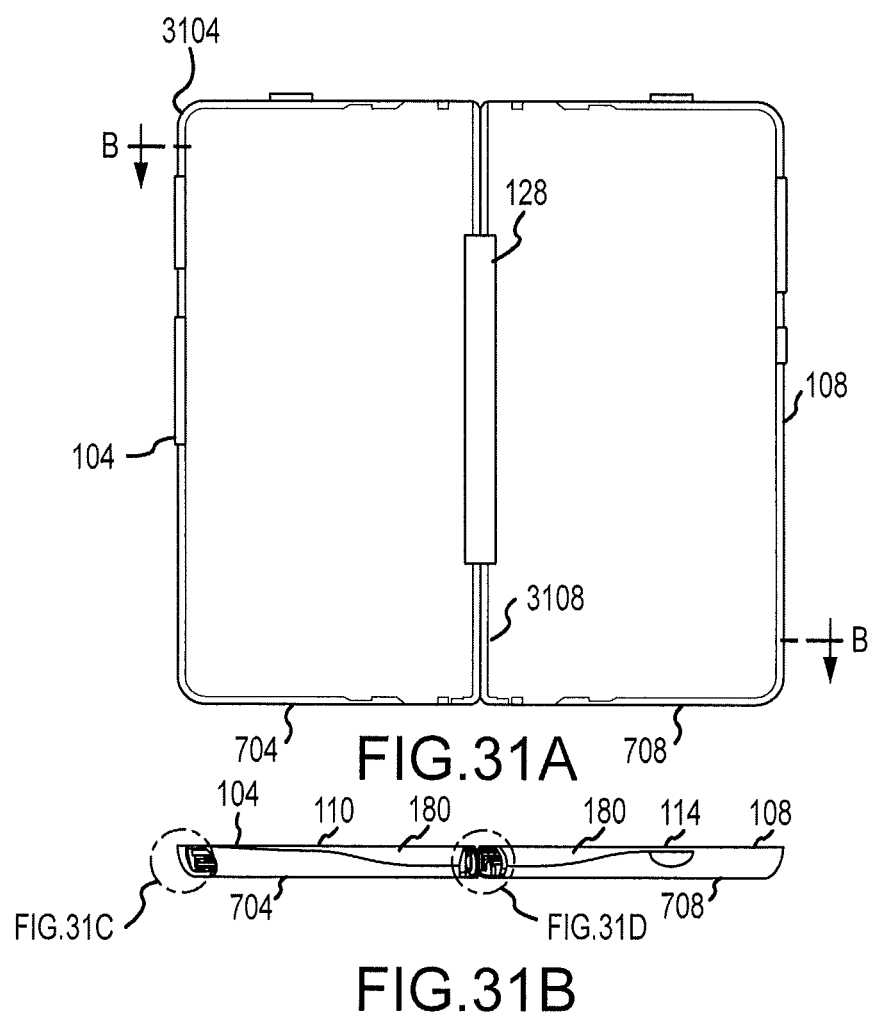

HINGE FOR A HANDHELD COMPUTING DEVICE

CROSS REFERENCE TO RELATED APPLICATION

The present application claims the benefit of and priority, under 35 U.S.C. §119(e), to U.S. Provisional Application Ser. No. 61/539,884, filed Sep. 27, 2011, entitled "MOBILE DEVICE," which is incorporated herein by this reference in its entirety for all that it teaches and for all purposes.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

A handheld computing device can include:
a first screen having a front surface, a rear surface, and a side surface extending between a periphery of the front and rear surfaces of the first screen, wherein the side surface of the first screen includes an opening;
a second screen having a front surface, a rear surface, and a side surface extending between the front and rear surfaces of the second screen, wherein the side surface of the second screen includes an opening; and
a hinge connected to the first screen so that the first screen is rotatable about a first pivot axis, the hinge connected to the second screen so that the second screen is rotatable about a second pivot axis, wherein the hinge is at least partially disposed within the openings of the first and second screens.

A hinge can include:
an elongate hub;
a first leaf rotatably connected to the hub about a first pivot axis; and
a second leaf rotatably connected to the hub about a second pivot axis, wherein the first and second pivot axes are substantially parallel.

A method of assembling a handheld computing device can include:
positioning the hinge at least partially within the opening of the first screen;
positioning the hinge at least partially within the opening of the second screen;
connecting the hinge to the first screen so that the first screen is rotatable about the first pivot axis; and connecting the hinge to the second screen so that the second screen is rotatable about the second pivot axis.

The hinge can have a range of motion of at least about 180 degrees so that the device is foldable between an open position in which the first and second screens are juxtaposed in substantially the same plane and a closed position in which the first and second screens are oriented substantially back-to-back in adjacent planes, wherein the front surfaces of the first and second screens each include a display area, and wherein, when the hinge is in a closed position, the display areas face in opposing directions.

The hinge can be one or more of a barrel hinge, pivot hinge, butt/mortise hinge, case hinge, continuous or piano hinge, concealed hinge, butterfly hinge, flag hinge, strap hinge, H hinge, HL hinge, counterflap hinge, flush hinge, coach hinge, rising butt hinge, double action spring hinge, Tee hinge, fraction hinge, security hinge, cranked hinge, lift-off hinge, self-closing hinge, butt hinge, butler tray hinge, card table hinge, and drop leaf table hinge.

The hub can include an internal passage extending between the openings of the first and second screens, the internal passage passing a flexible circuit.

The hinge can further include a hub and first and second leaves, wherein the first leaf is rotatably connected to the hub about the first pivot axis, wherein the second leaf is rotatably connected to the hub about the second pivot axis, wherein the first leaf is connected to the first screen, and wherein the second leaf is connected to the second screen.

When the device is in the open position, the openings of the first and second screens can substantially oppose each other.

When the device is in the open position, the hinge can be substantially disposed within an outer envelope of the device.

When the device is in the open position, the hinge can be substantially flush with the rear surfaces of the first and second screens.

When the device is in the closed position, the hinge can be substantially disposed within an outer envelope of the device.

When the device is in the closed position, the hinge can be substantially flush with the side surfaces of the first and second screens.

The hinge can have an axis of rotation that is substantially co-planar with the back surface of each of the first and second screens. The hinge can be incorporated into the body of the device. This configuration can allow the hinge to be compact and reduce the overall dimensions of the device. When the two screens are positioned side-by-side, the hinge is hidden from front view. When the two screens are positioned back-to-back, the hinge can not protrude beyond a housing of the phone. Accordingly, the hinge can be compact and not detract from the overall aesthetics of the device.

The present disclosure can provide a number of advantages depending on the particular aspect, embodiment, and/or configuration. For example, currently, the consumer electronics industry is dominated by single-screen devices. Unfortunately, these devices are limited in the manner in which they can efficiently display information and receive user input. Specifically, multiple applications and desktops cannot be adequately shown on a single screen and require the user to constantly switch between displayed pages to access content from more than one application. Additionally, user input devices such as keyboards, touch-sensitive or capacitive displays, and hardware interface buttons are usually reduced in size to fit onto a single-screen device. Manipulating this type of device, and being forced to switch between multiple applications that only use one screen results in user fatigue, frustration, and in some cases repetitive motion injuries.

Recently, dual-screen devices have been made available to consumers of electronic devices. However, the currently available dual-screen devices have failed to adequately address the needs of the consumer. Although the devices include two screens in their design, the devices tend to be cumbersome and difficult to maneuver. In particular, the typical dual-screen device has a relatively large envelope that detracts from the utility and aesthetics of the device. For example, as the envelope of the device increases in size, a user experiences increased difficulty in storing and/or using the device, for example as a mobile phone. In addition, the typical dual-screen device includes a bulky hinge that increases the overall envelope of the device. The present disclosure addresses the limitations of the traditional single/dual-screen devices and provides advantages in envelope size and maneuverability.

In embodiments, the present disclosure provides a dual-screen device employing a mechanical design that reduces the overall envelope of the device while providing a robust housing that protects the internal components of the device. In embodiments, the device may utilize a selectively reinforced outer shell configured to reduce the thickness of the device. In some areas, the outer shell may be reinforced by additional material and/or internal components of the device, thereby enabling the envelope of the housing to be reduced as compared to typical dual-screen devices. For example, a polymeric material may be nanomolded on the housing to provide rigidity to predetermined areas of the housing. As another example, stiffeners may be selectively associated with the interior of the housing to provide rigidity to predetermined locations of the housing while not detracting from the overall size or appearance of the device. As a further example, operable device components, such as a battery and/or a printed circuit board, may be utilized to provide rigidity to the housing. Furthermore, in embodiments, the device may utilize a backing plate configured to provide rigidity and consistent behavior for at least one button associated with the device. The backing plate also may be utilized to define a datum for positioning a component, such as a battery, within the housing. Moreover, in embodiments, the device may utilize a compact hinge that is substantially disposed within an outer envelope of the device. The hinge may be at least partially disposed within opposing sidewalls of the dual screens and thus not detract from the overall size and/or appearance of the device. The hinge may include a plurality of axes, enabling a user to easily maneuver the dual screens between various orientations. Additionally, in embodiments, the device may include a secondary support for a dock connector to accommodate various misalignments and/or other connection issues with a peripheral device. In embodiments, the secondary support and/or the dock connector are not structurally connected to a printed circuit board, thereby removing the printed circuit board from the dock connector load path, which can damage the printed circuit board. These and other advantages will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "composited display" refers to a logical structure that defines a display that can encompass one or more screens. A multi-screen display can be associated with a composite display that encompasses all the screens. The composite display can have different display characteristics based on the various orientations of the device.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

A "multi-screen application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application is incapable of the several modes discussed with the multi-screen application.

The term "window" refers to a, typically rectangular, displayed image on at least part of a display that contains or provides content different from the rest of the screen. The window may obscure the desktop.

The terms "determine", "calculate" and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

Unless otherwise indicated, all dimensions included in the figures are to be understood as being modified in all instances by the term "about". All dimensions included in the figures have units of millimeters or degrees.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 3B is a table of an embodiment of the state model for the device based on the device's orientation and/or configuration.

FIGS. 15A-D are views of an embodiment of an input/output retainer bracket with example dimensions;
FIG. 20A is a sectional view along line A-A of FIG. 19;
FIG. 20B is a sectional view along line B-B of FIG. 19;
FIG. 20C is a sectional view along line C-C of FIG. 19;
FIG. 20D is a sectional view along line D-D of FIG. 19;
FIG. 20E is a sectional view along line E-E of FIG. 19;
FIG. 20F is a sectional view along line F-F of FIG. 19;
FIG. 20G is a sectional view along line G-G of FIG. 19;
FIG. 20H is a sectional view along line H-H of FIG. 19;
FIG. 20J is a sectional view along line J-J of FIG. 19;
FIG. 20K is a sectional view along line K-K of FIG. 19;
FIG. 20L is a sectional view along line L-L of FIG. 19;
FIG. 20M is a sectional view along line M-M of FIG. 19;
FIG. 20N is a sectional view along line N-N of FIG. 19;
FIG. 21A is a top view of a display panel frame according to an embodiment;
FIG. 21B is a bottom view of the display panel frame;
FIG. 22A is a sectional view along line A-A of FIG. 21A
FIG. 22B is a sectional view along line B-B of FIG. 21A;
FIG. 22C is a sectional view along line C-C of FIG. 21A;
FIG. 22D is a sectional view along line D-D of FIG. 21A;
FIG. 22E is an enlarged view of the highlighted feature of FIG. 22A;

FIG. 22F is an enlarged view of the highlighted feature of FIG. 22B;

FIG. 22G is an enlarged view of the highlighted feature of FIG. 22C;

FIG. 22H is an enlarged view of the highlighted feature of FIG. 22D;

FIG. 28A is a top view of the support bracket and light guides according to an embodiment;

FIG. 28B is a front view of the support bracket and light guides;

FIG. 28C is a bottom view of the support bracket and light guides;

FIG. 28D is a rear view of the support bracket and light guides;

FIGS. 29A-B depict the light guides in bottom and top views, respectively;

FIG. 30A is a rear view of the device according to an embodiment;

FIG. 30B is a sectional view along line B-B of FIG. 30A;

FIG. 31A is a rear view of the device according to an embodiment;

FIG. 31B are sectional views along line B-B of FIG. 30A;

Figure 1A:
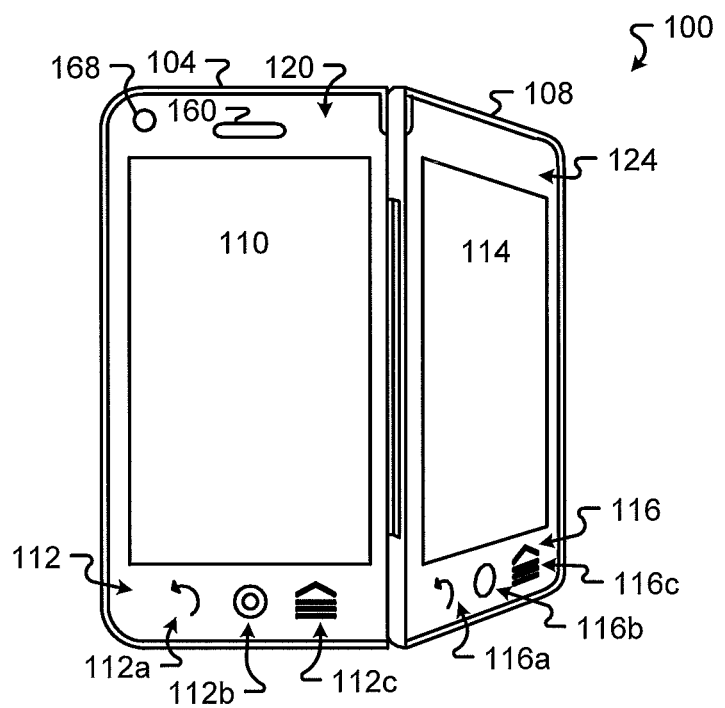
FIG. 1A includes a first view of an embodiment of a multi-screen user device.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-J illustrate a device 100 in accordance with embodiments of the present disclosure. As described in greater detail below, device 100 can be positioned in a number of different ways each of which provides different functionality to a user. The device 100 is a multi-screen device that includes a first screen 104 and a second screen 108, both of which are touch sensitive. In embodiments, the entire front surface of screens 104 and 108 may be touch sensitive and capable of receiving input by a user touching the front surface 102 of the screens 104 and 108. First screen 104 includes touch sensitive display 110, which, in addition to being touch sensitive, also displays information to a user. Second screen 108 includes touch sensitive display 114, which also displays information to a user. In other embodiments, screens 104 and 108 may include more than one display area.

First screen 104 also includes a configurable area 112 that has been configured for specific inputs when the user touches portions of the configurable area 112. Second screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-C and 116a-C may be configured for specific inputs depending upon the application running on device 100 and/or information displayed on touch sensitive displays 110 and/or 114.

In addition to touch sensing, first screen 104 and second screen 108 may also include areas that receive input from a user without requiring the user to touch the display area of the screen. For example, first screen 104 includes gesture capture area 120, and second screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1B:
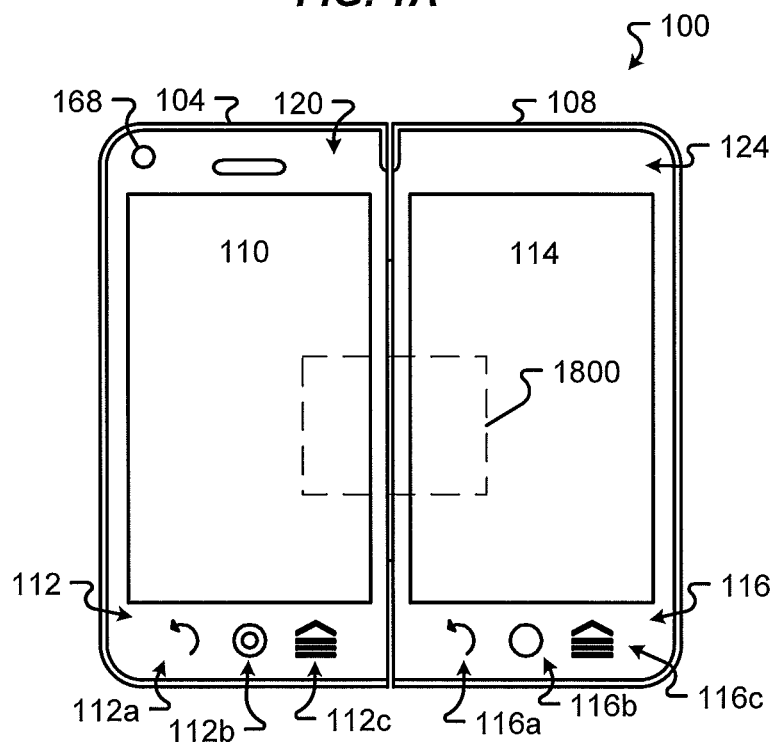
FIG. 1B includes a second view of an embodiment of a multi-screen user device.
Figure 1F:
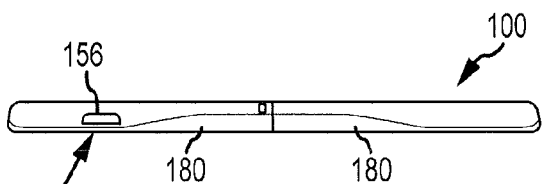
FIG. 1F includes a sixth view of an embodiment of a multi-screen user device.
Figures 1C, 1D, 1E:
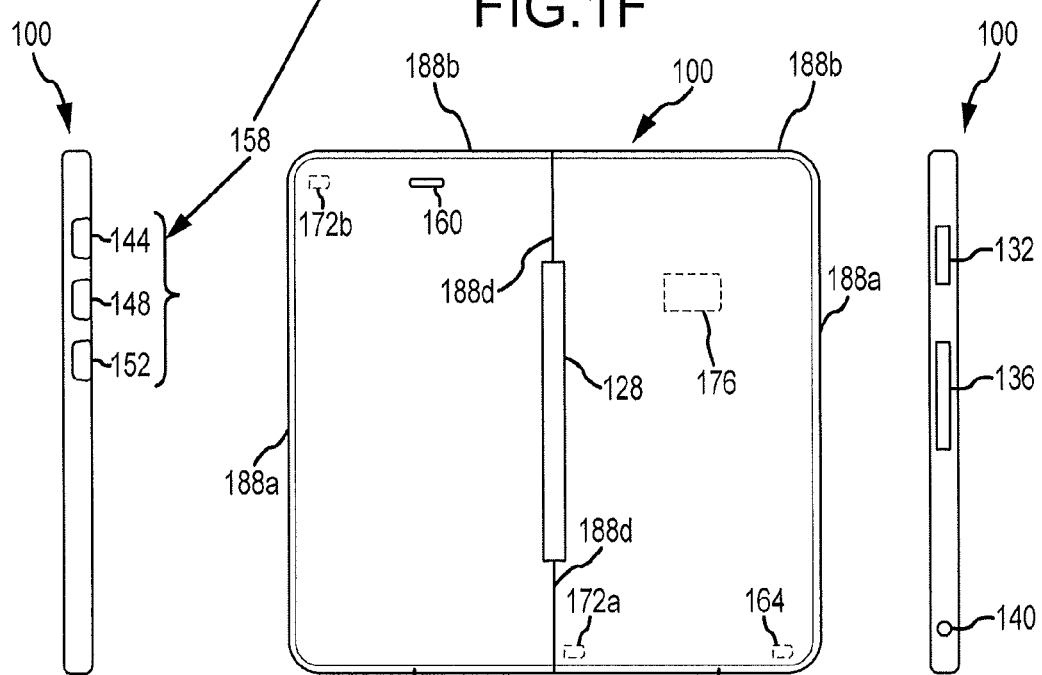
FIG. 1C includes a third view of an embodiment of a multi-screen user device.
FIG. 1D includes a fourth view of an embodiment of a multi-screen user device.
FIG. 1E includes a fifth view of an embodiment of a multi-screen user device.
Figure 1G:
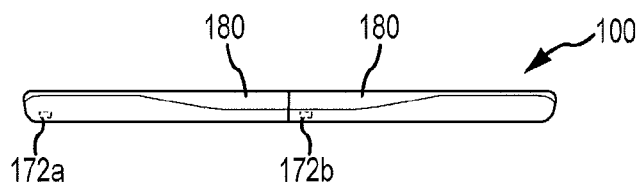
FIG. 1G includes a seventh view of an embodiment of a multi-screen user device.

The two screens 104 and 108 are connected together with a hinge 128, shown clearly in FIG. 1C (illustrating a rear view of device 100). Hinge 128, in the embodiment shown in FIGS. 1A-J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, second screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of first screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button 154, an example of which is shown in FIGS. 1D-E. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, 154, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors (discussed below with reference to FIGS. 31A-D). However, in other embodiments other sensors can be used in addition to or in lieu of the Hall effect sensors. An accelerometer 176 may also be included as part of device 100 to determine the orientation of the device 100 and/or the orientation of screens 104 and 108. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
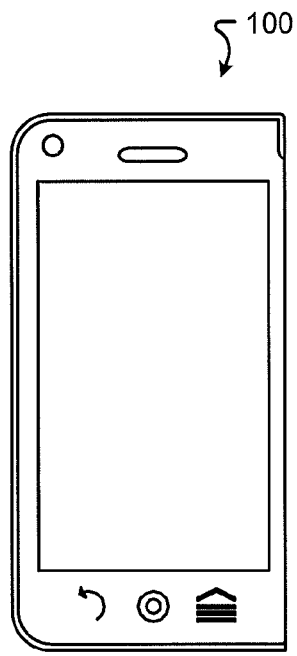
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Device 100 may also have a beveled edge to assist a user in gripping and opening the device 100 when in the closed position. FIGS. 1A-J and 16-17 illustrate side views of embodiments of a device 100 having a beveled edge 180 formed in at least one side of at least one of the screens 104 and 108. In the depicted example, each screen 104 and 108 has a front surface 102, a rear surface 184, and a beveled edge 180 extending between the front surface 102 and the rear surface 184. When the device is in the closed position, the beveled edge 180 of each screen 104 and 108 angles inwardly toward the other respective screen 104 and 108 to provide an angled surface configured to facilitate gripping and/or opening the device 100. To open the device 100 from the closed position, a user may place at least one finger on a beveled edge 180 to pry open the device 100.

The beveled edge 180 can be formed at various angles relative to the front and/or rear surfaces 102 and 184 of the respective screens 104 and 108. In one embodiment, a beveled edge 180 is formed in each screen 104 and 108 at an angle between about 30 to about 90 degrees relative to the front surface 102 of the respective screens 104 and 108. In another embodiment, a beveled edge 180 is formed in each screen 104 and 108 at an angle between about 60 to about 85 degrees relative to the front surface 102 of the respective screens 104 and 108. If formed in each screen 104 and 108, the beveled edge 180 of each screen 104 and 108 may be formed at approximately the same angle, or different angles, relative to the front surface 102 of the respective screens 104 and 108.

The beveled edge 180 can be formed in various sides of at least one of the screens 104 and 108. For example, at least one side of at least one of the screens 104 and 108 may be angled relative to the front and/or rear surfaces 102 and/or 184 of the respective screen. In one embodiment, at least one side of the first screen 104 and at least one side of the second screen 108 is angled relative to the front and rear surfaces 102 and 184 of the respective screen. Referring to FIGS. 1A-J and 16-17, the beveled edge 180 is formed in at least a portion of three sides 188a, 188b, and 188c of each screen 104 and 108. Referring specifically to FIGS. 1A-J and 16-17, a beveled edge 180 is formed in a portion of the top side 188b and the bottom side 188c of each screen 104 and 108. Referring now to FIGS. 1A-J and 16-17, the beveled edge 180 is formed in a portion of the bottom side 188c of each screen 104 and 108, and the beveled edge 180 is formed in the left side 188a of each screen 104 and 108. Also illustrated in FIGS. 1A-J and 16-17, the beveled edge 180 does not extend to the right side 188d of the device 100. Referring to FIGS. 1A-J and 16-17, the hinge 128 is positioned centrally in the right side 188d of the device 100.

Referring still to FIGS. 1A-J and 16-17, the beveled edge 180 may be formed in each screen 104 and 108 to oppose each other when the device is in the closed position. For example, the beveled edge 180 illustrated in FIGS. 1A-J and 16-17 is formed in the same sides of the screens 104 and 108 and is formed in each screen to be substantially a mirror image about the back surfaces 184 of the screens 104 and 108 when the device is in the closed position. In alternative embodiments, the beveled edge 180 may be formed in non-complementary locations along the sides of the device 100. For example, a beveled edge 180 may be formed on different sides of the screens 104 and 108 and/or on an adjacent side but in different locations along the respective side of the device 100.

Audio jacks, buttons, ports, and/or slots can be included in the beveled edge 180. In FIGS. 1D-E, buttons 148 and 152 and a rocker button 144 are associated with the beveled edge 180 of the first screen 104, and an audio jack 140, a card slot 132 and a port 136 are formed in the beveled edge 180 of the second screen 108. The button, ports, and/or slots can be included in a beveled edge 180 of any screen or side of the device 100.

Other features also can be associated with the beveled edge 180 to facilitate gripping and/or opening the device 100. For example, an elastomeric material, such as rubber, may be adhered to the beveled edge 180 to improve grip. As another example, surface protuberances, such as detents, protrusions, and/or ridges, may be formed in or connected to the beveled edge 180 to assist in gripping and/or opening the device 100. In alternative embodiments, these other features may be associated with non-beveled portions of at least one side of at least one screen of the device 100 to ease gripping and/or opening the device 100.

In embodiments, at least one side 188a, 188b, 188c, and 188d of at least one screen 104 and 108 can be arcuate shaped. For example, at least one side can be convex and/or concave to facilitate gripping and/or opening the device 100. In addition, at least one edge of the front surface 102 and/or rear surface 184 of the first screen 104 and/or second screen 108 may be rounded. In one embodiment, every edge of the front surface 102 and the rear surface 184 of each screen 104 and 108 is rounded with a predetermined radius of curvature to remove all sharp edges of the device 100.

Figure 1I:
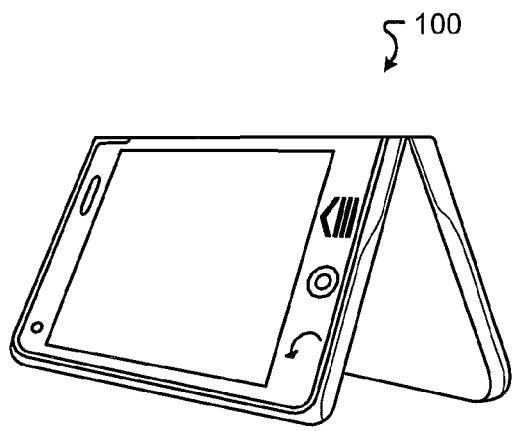
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
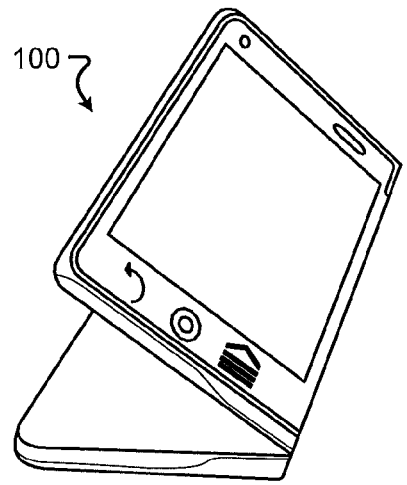
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-J and the description provided above are nonlimiting.

Figure 2:
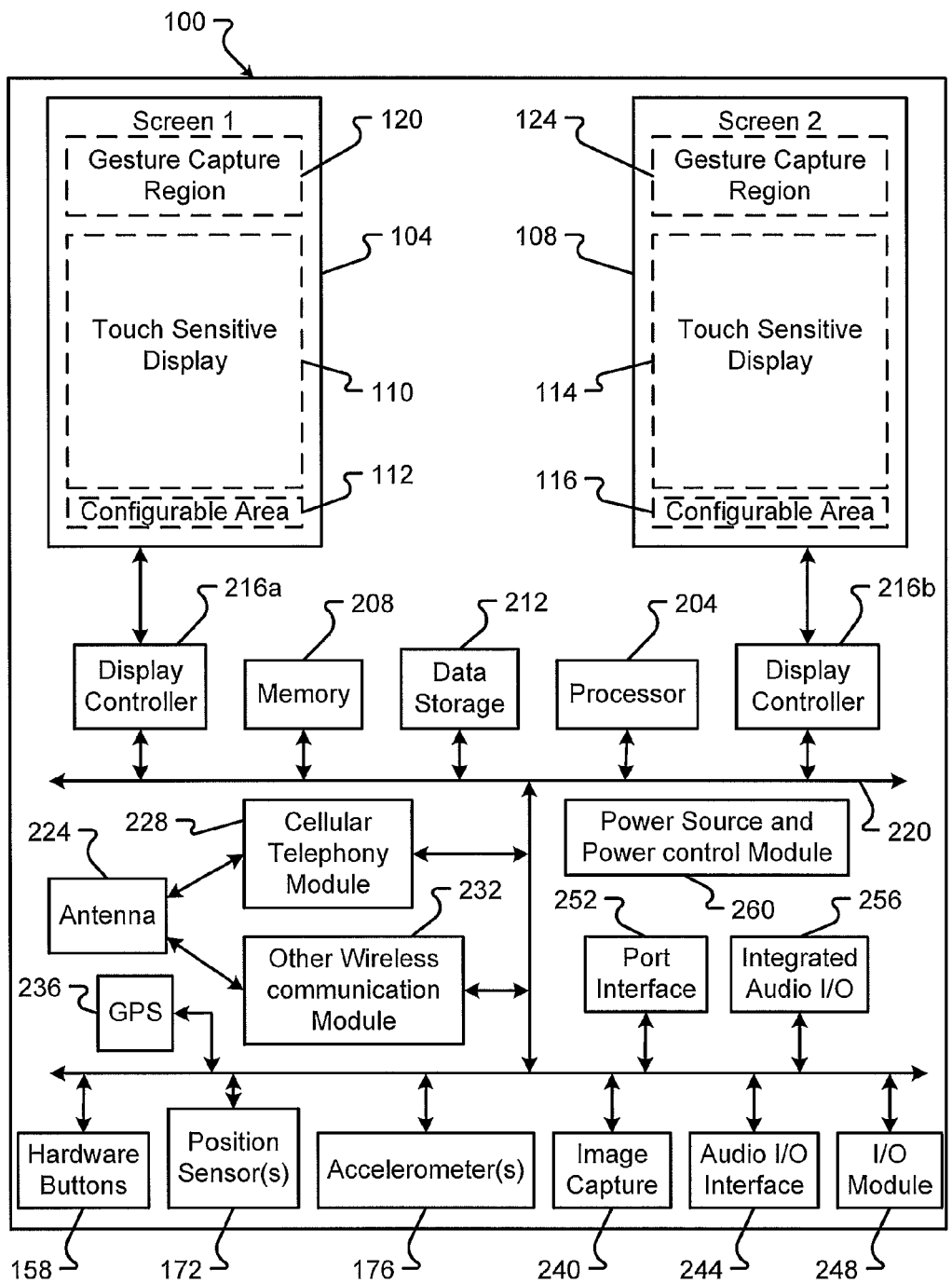
FIG. 2 is a block diagram of an embodiment of the hardware of the device.

Hardware Features:

FIG. 2 illustrates components of a device 100 in accordance with embodiments of the present disclosure. In general, the device 100 includes a first screen 104 and a second screen 108. While the first screen 104 and its components are normally enabled in both the opened and closed positions or states, the second screen 108 and its components are normally enabled in the opened state but disabled in the closed state. However, even when in the closed state a user or application triggered interrupt (such as in response to a phone application or camera application operation) can flip the active screen, or disable the first screen 104 and enable the second screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller 216 may be used to control each of the included touch sensitive screens 104 and 108. In accordance with still other embodiments, the functions of a touch screen controller 216 may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present invention, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present invention can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a reed switch, a multiple position switch, an optical switch, a Wheatstone bridge, a potentiometer, a mechanical switch on the hinge 128, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
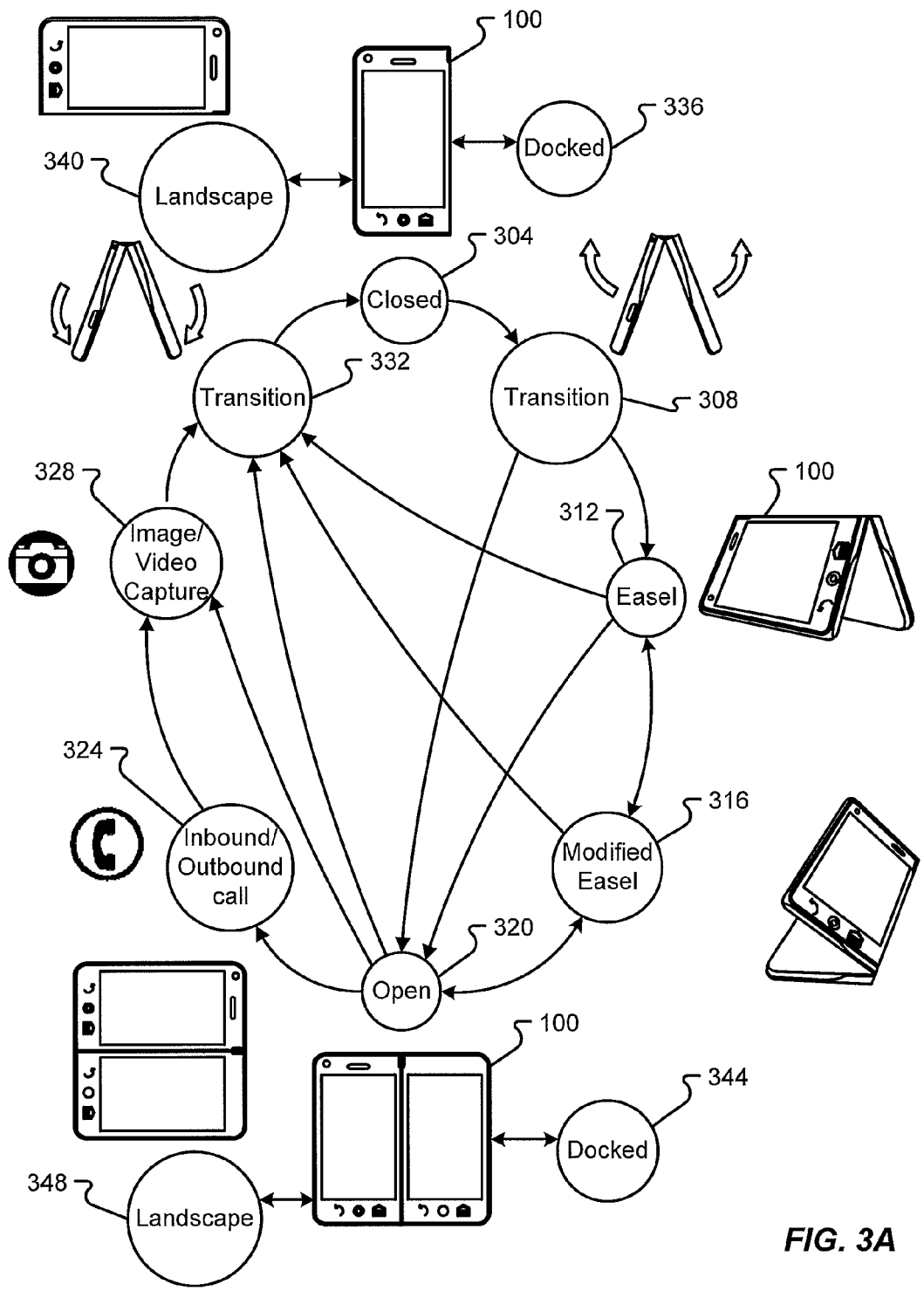
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the first screen 104 and the second screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the first screen 104 facing the user, and the first screen 104 and the second screen 108 being back-to-back.

In the closed state, the device can also move to a transitional state where the device remains closed but the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the first screen 104 and the second screen 108 being rotated around a point of axis coincidence with the hinge. Upon entering the easel state 312, the first screen 104 and the second screen 108 are separated from one another such that, for example, the device 100 can sit in an easel-like configuration on a surface.

In state 316, known as the modified easel position, the device 100 has the first screen 104 and the second screen 108 in a similar relative relationship to one another as in the easel state 312, with the difference being one of the first screen 104 or the second screen 108 are placed on a surface as shown.

State 320 is the open state where the first screen 104 and the second screen 108 are generally on the same plane. From the open state, the device 100 can transition to the docked state 344 or the open landscape state 348. In the open state 320, the first screen 104 and the second screen 108 are generally in the portrait-like orientation while in landscaped state 348 the first screen 104 and the second screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 322 illustratively shows first screen 104 and the second screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110, 114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
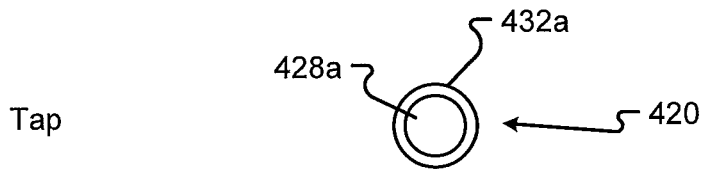
FIG. 4A is a first representation of an embodiment of user gesture received at a device.
Figure 4B:
FIG. 4B is a second representation of an embodiment of user gesture received at a device.
Figure 4C:
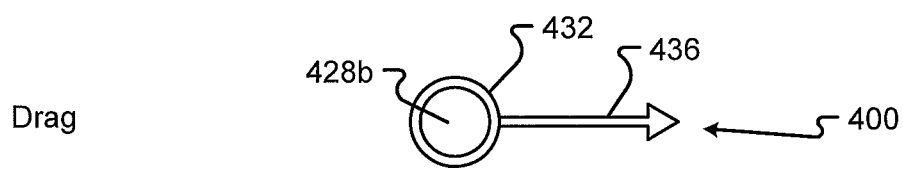
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
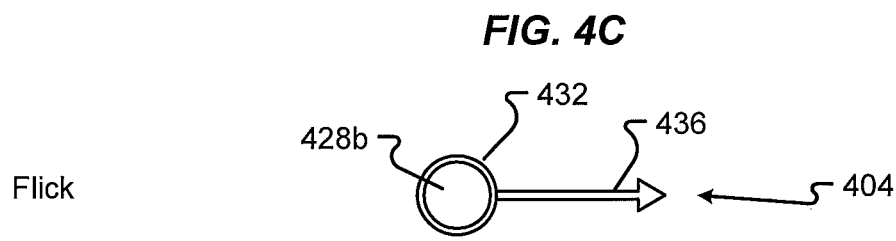
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
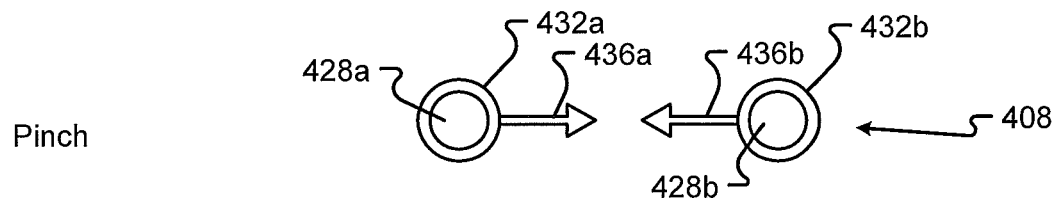
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428 to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436 a, b, respectively. The first and second contact movements 436 a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
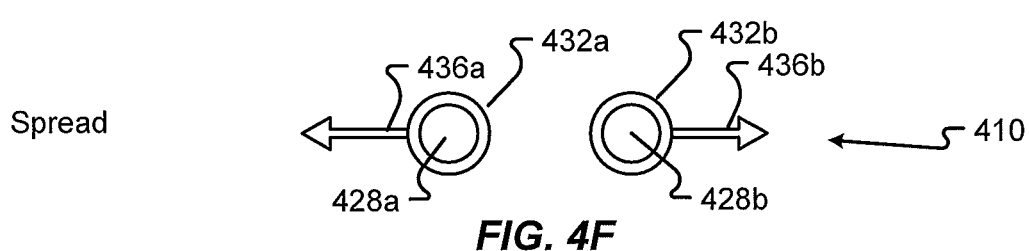
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436a, b, respectively. The first and second contact movements 436 a, b are generally in a common direction. Stated another way, the first and second contact movements 436 a, b are away from the first and second contacts 428a, b. More simply stated, the spread gesture 410 may be accomplished by a user's digits touching the screen 104,108 in a spreading motion.

Figure 4G:
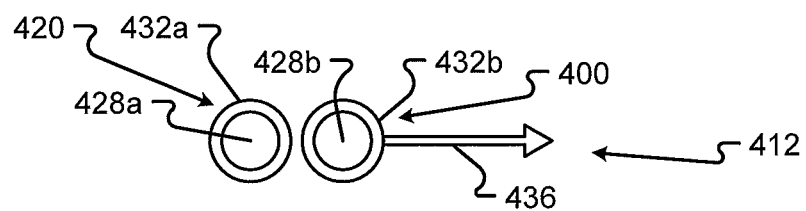
FIG. 4G is a seventh representation of an embodiment of user gesture received at a device.
Figure 4H:
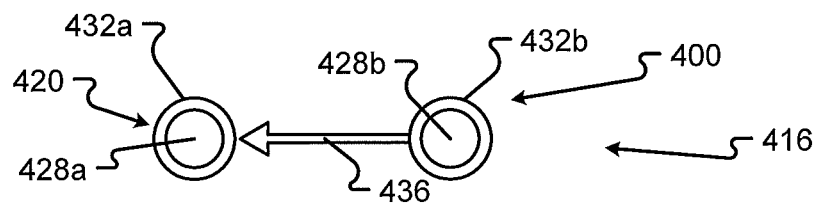
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an a touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Firmware and Software:

The memory 508 may store and the processor 504 may execute one or more software components. These components can include at least one operating system (OS) 516, an application manager 562, a desktop 566, and/or one or more applications 564a and/or 564b from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an up event, which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can upscale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110, 114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 is based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5A:
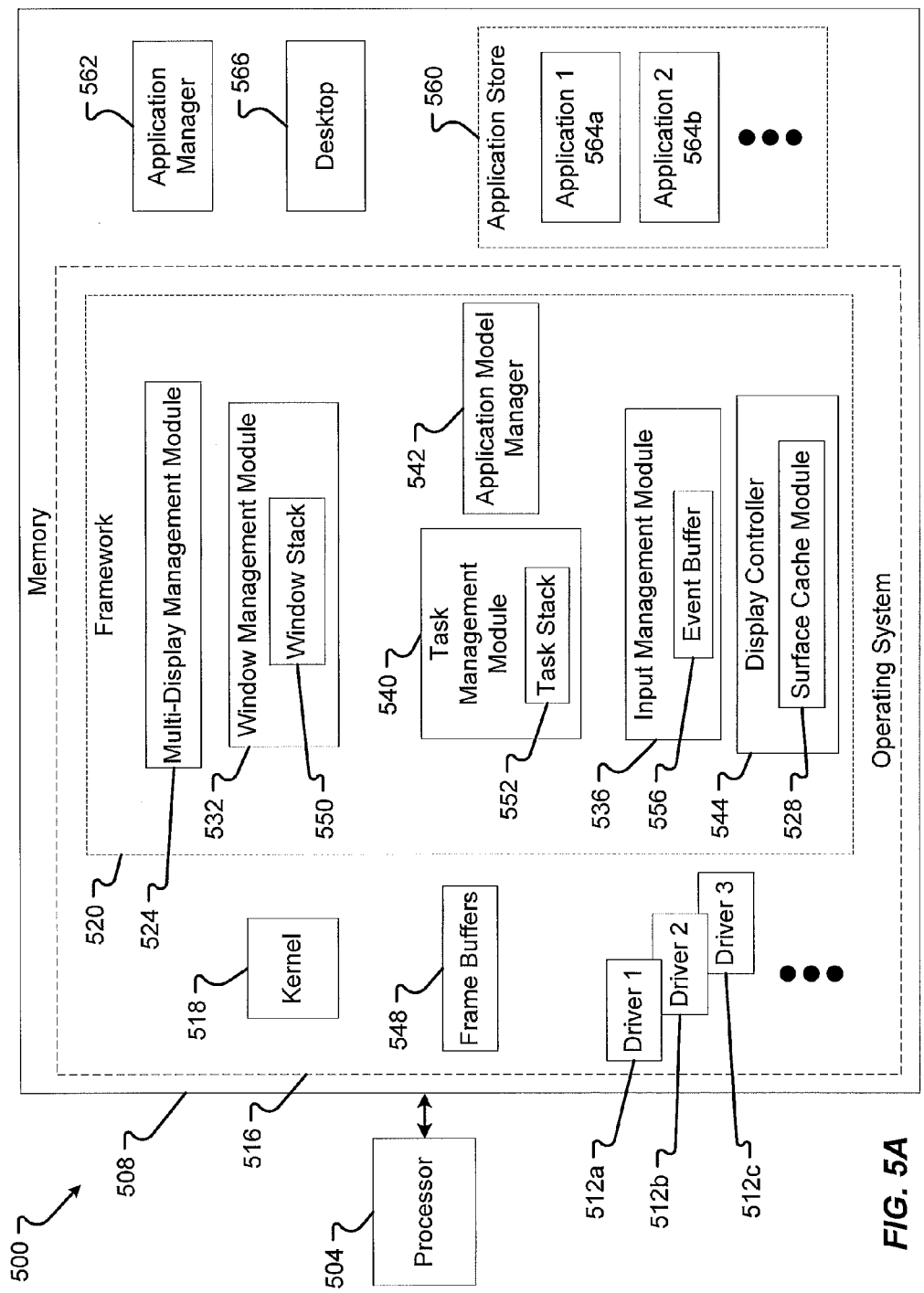
FIG. 5A is a block diagram of an embodiment of the device software and/or firmware.
Figure 5B:
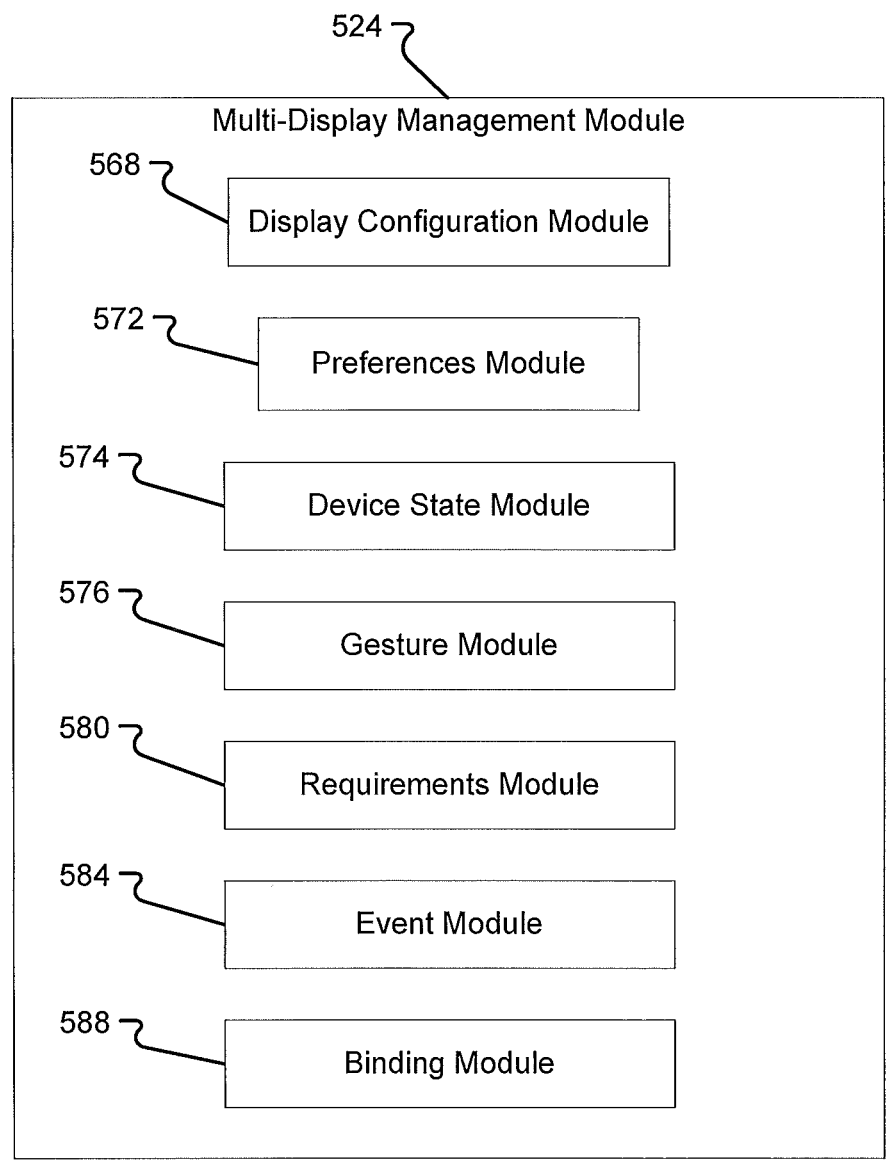
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window(s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a second screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6B:
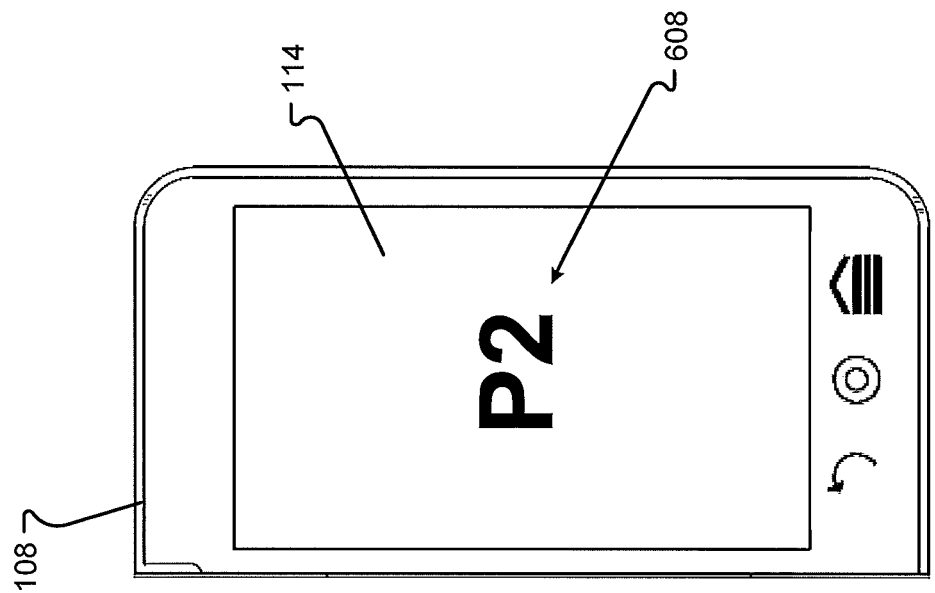
FIG. 6B is a second representation of an embodiment of a device configuration generated in response to the device state.
Figure 6A:
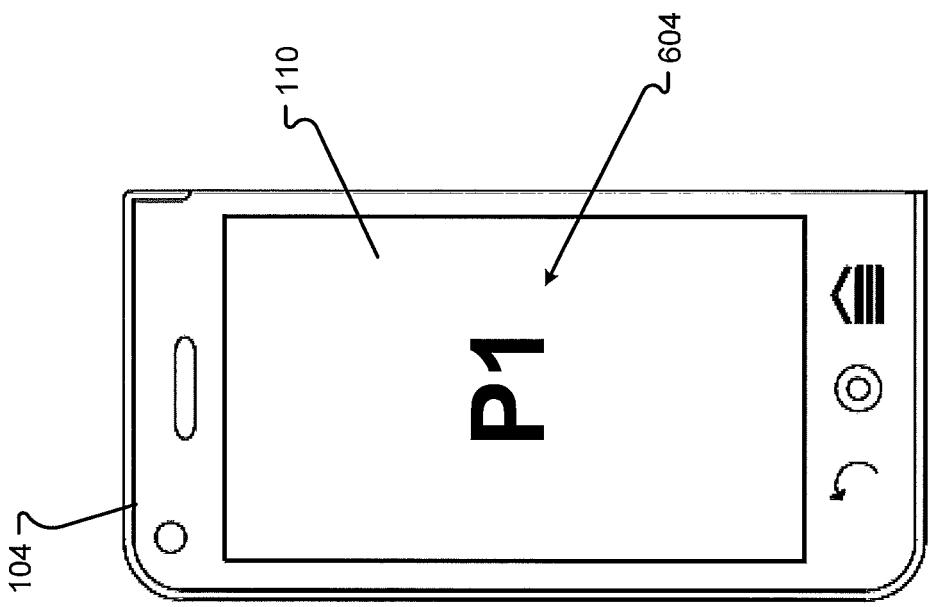
FIG. 6A is a first representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the first screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the second screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

Figure 6C:
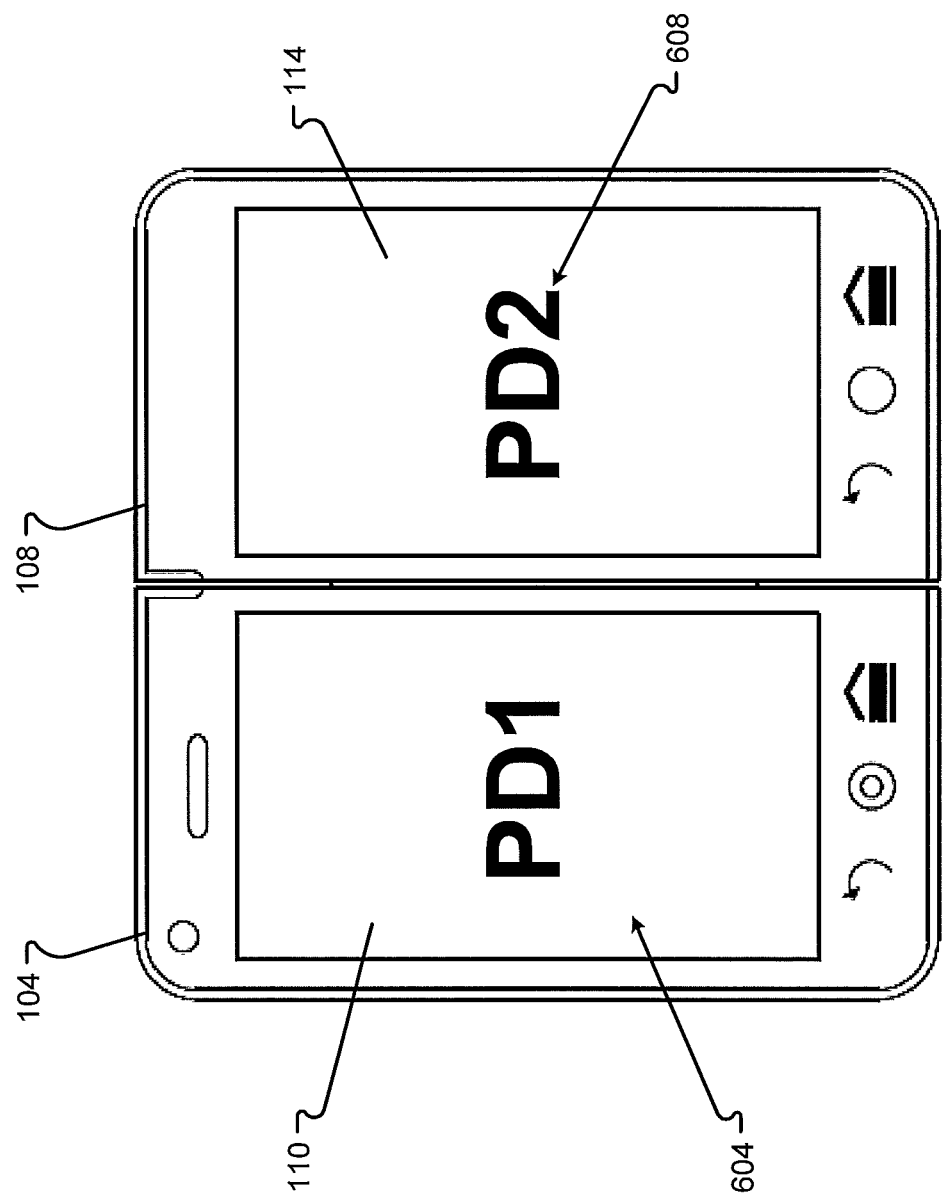
FIG. 6C is a third representation of an embodiment of a device configuration generated in response to the device state.

An alternative output configuration may be accommodated by the device 100 being in a second state. Specifically, FIG. 6C depicts a third portrait configuration where data is displayed simultaneously on both the first screen 104 and the second screen 108. The third portrait configuration may be referred to as a Dual-Portrait (PD) output configuration. In the PD output configuration, the touch sensitive display 110 of the first screen 104 depicts data in the first portrait configuration 604 while the touch sensitive display 114 of the second screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

Figure 6E:
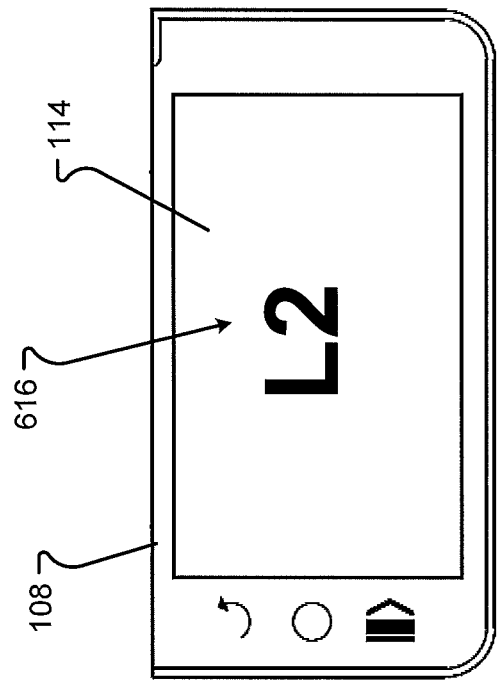
FIG. 6E is a fifth representation of an embodiment of a device configuration generated in response to the device state.
Figure 6D:
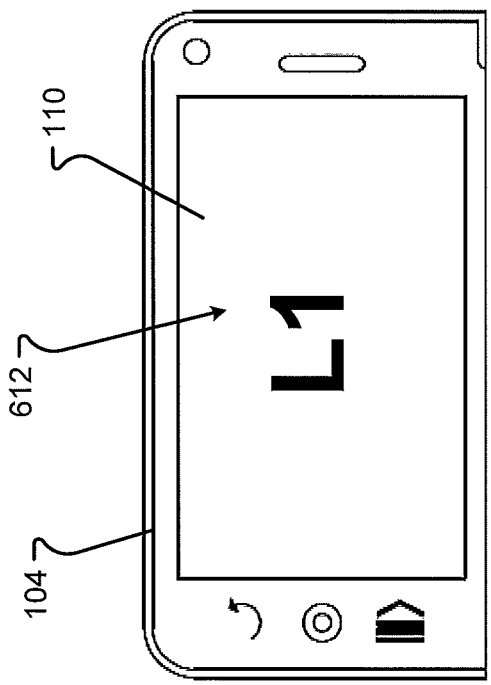
FIG. 6D is a fourth representation of an embodiment of a device configuration generated in response to the device state.

FIGS. 6D and 6E depicts two further output configurations of the device 100 being in a third state. Specifically, FIG. 6D depicts the device 100 being in a closed landscape state 340 where the data is displayed on the first screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the second screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

Figure 6F:
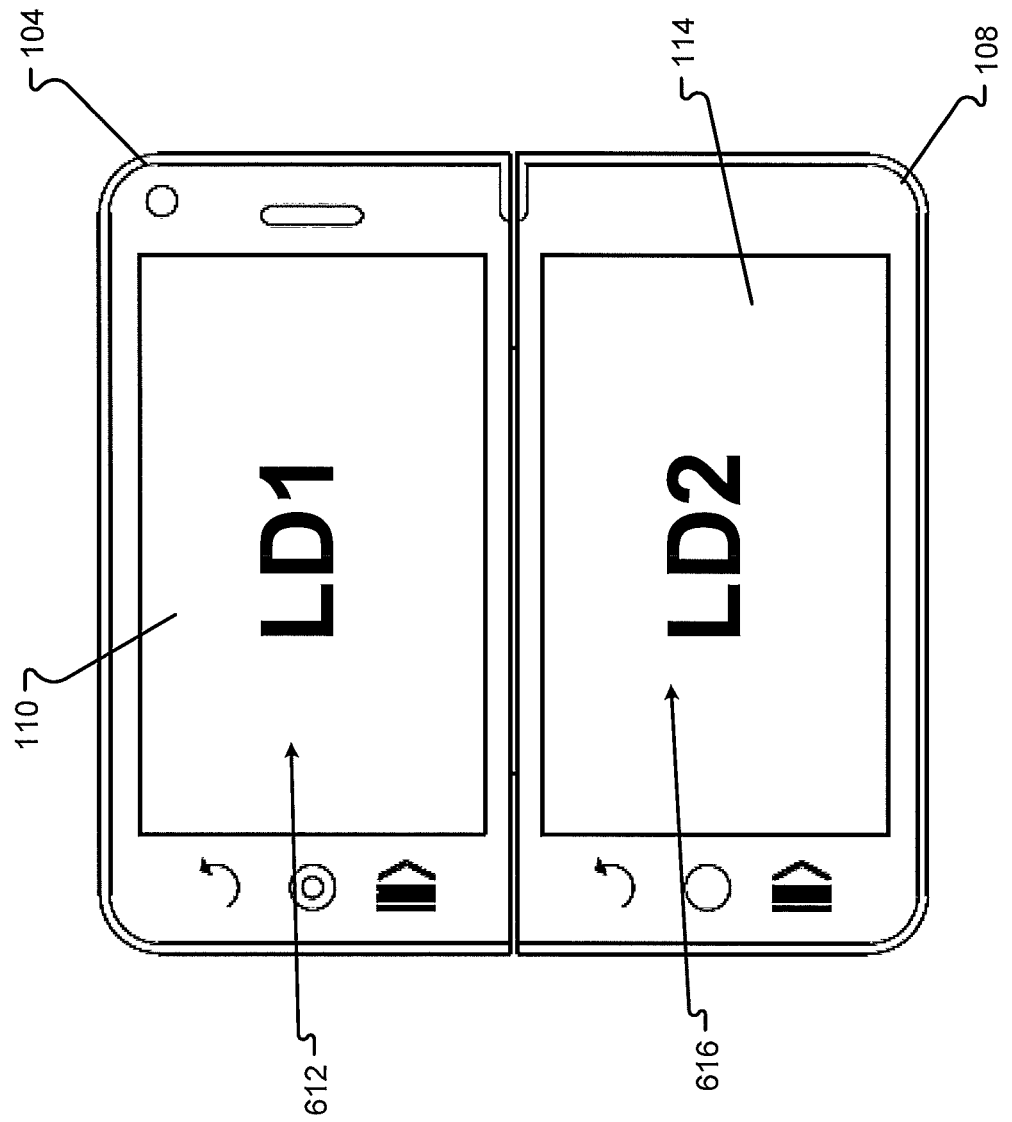
FIG. 6F is a sixth representation of an embodiment of a device configuration generated in response to the device state.

FIG. 6F depicts a third landscape configuration where data is displayed simultaneously on both the first screen 104 and the second screen 108. The third landscape configuration may be referred to as a Dual-Landscape (LD) output configuration. In the LD output configuration, the touch sensitive display 110 of the first screen 104 depicts data in the first landscape configuration 612 while the touch sensitive display 114 of the second screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

Figures 6G, 6H:
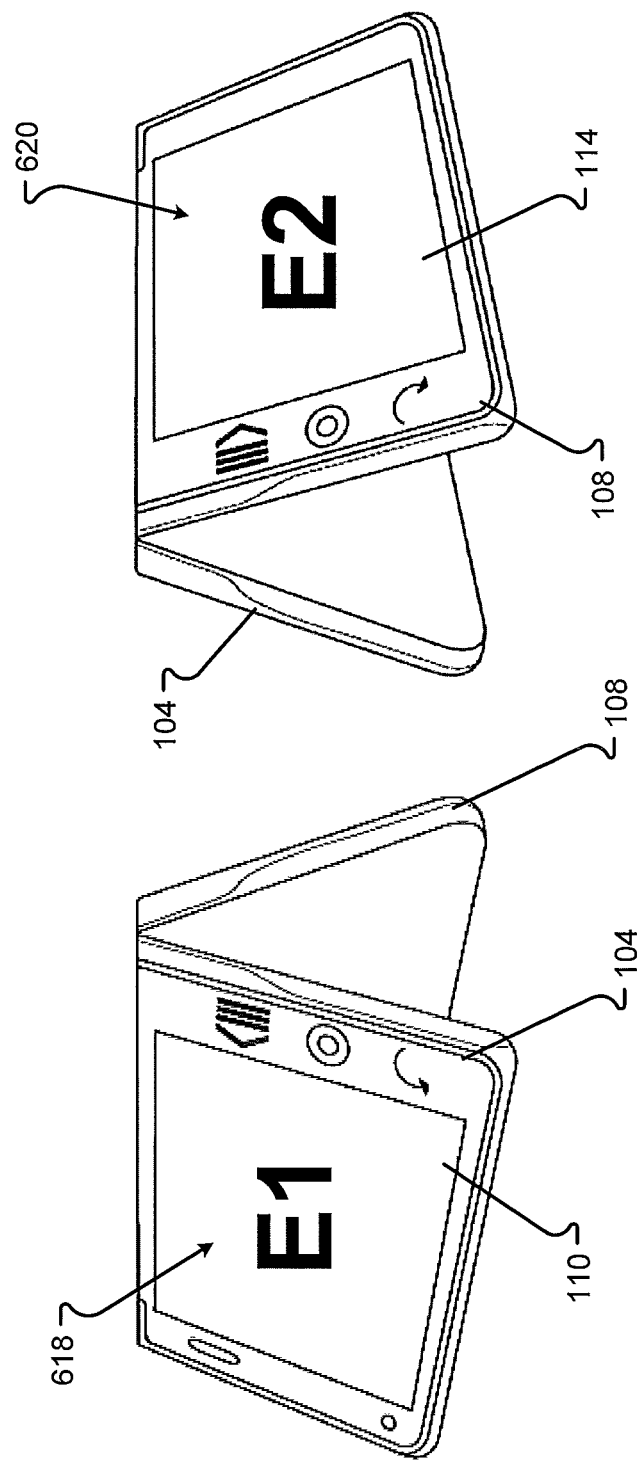
FIG. 6G is a seventh representation of an embodiment of a device configuration generated in response to the device state.
FIG. 6H is a eighth representation of an embodiment of a device configuration generated in response to the device state.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

Figure 6I:
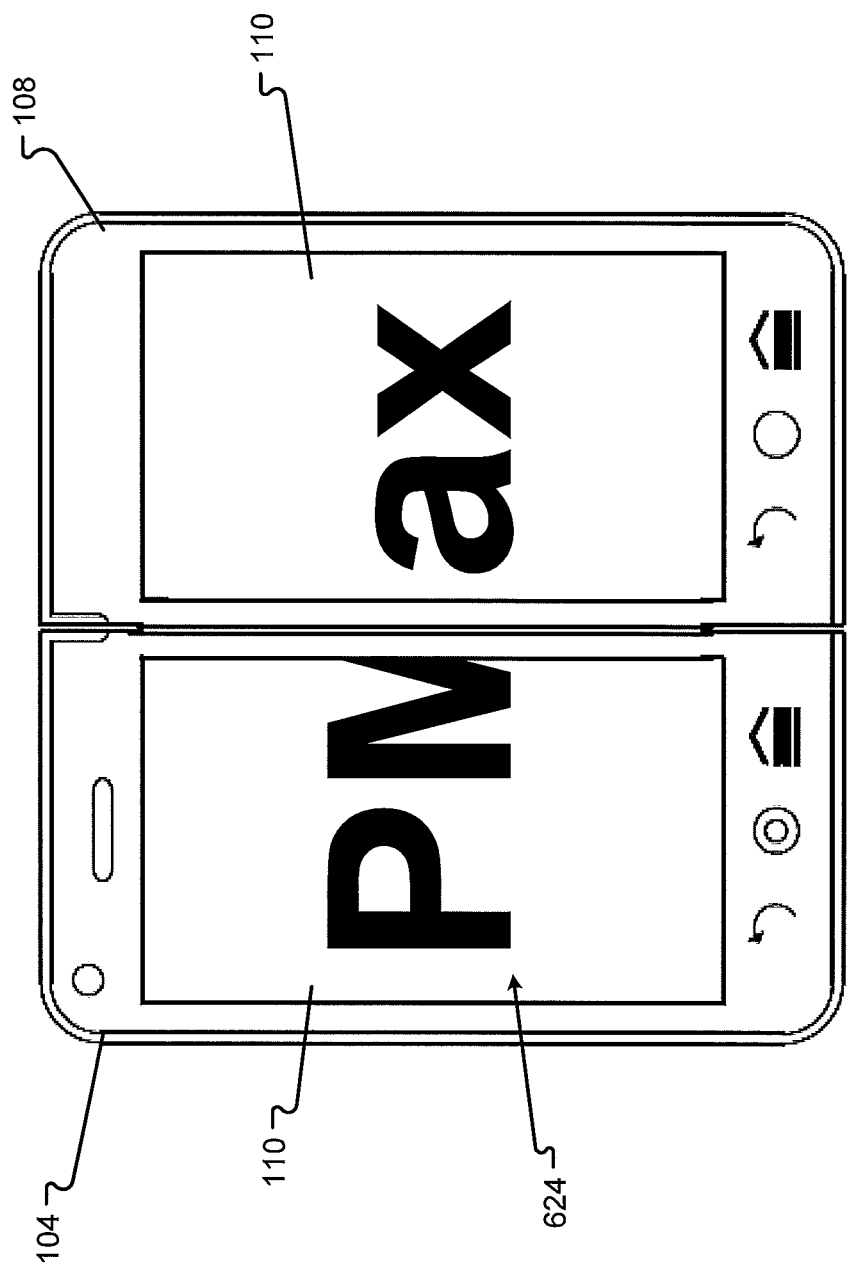
FIG. 6I is a ninth representation of an embodiment of a device configuration generated in response to the device state.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
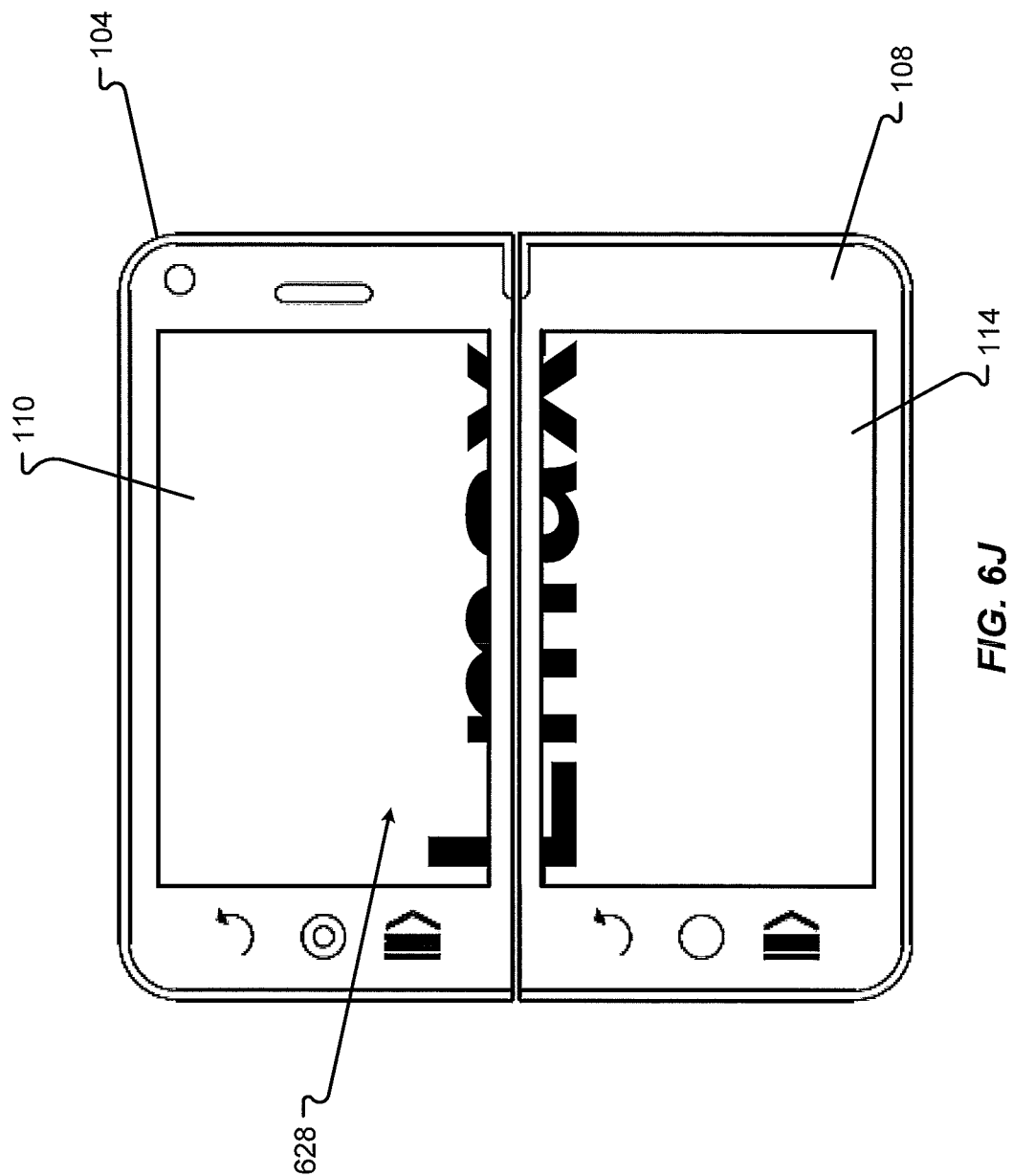
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

Figure 7:
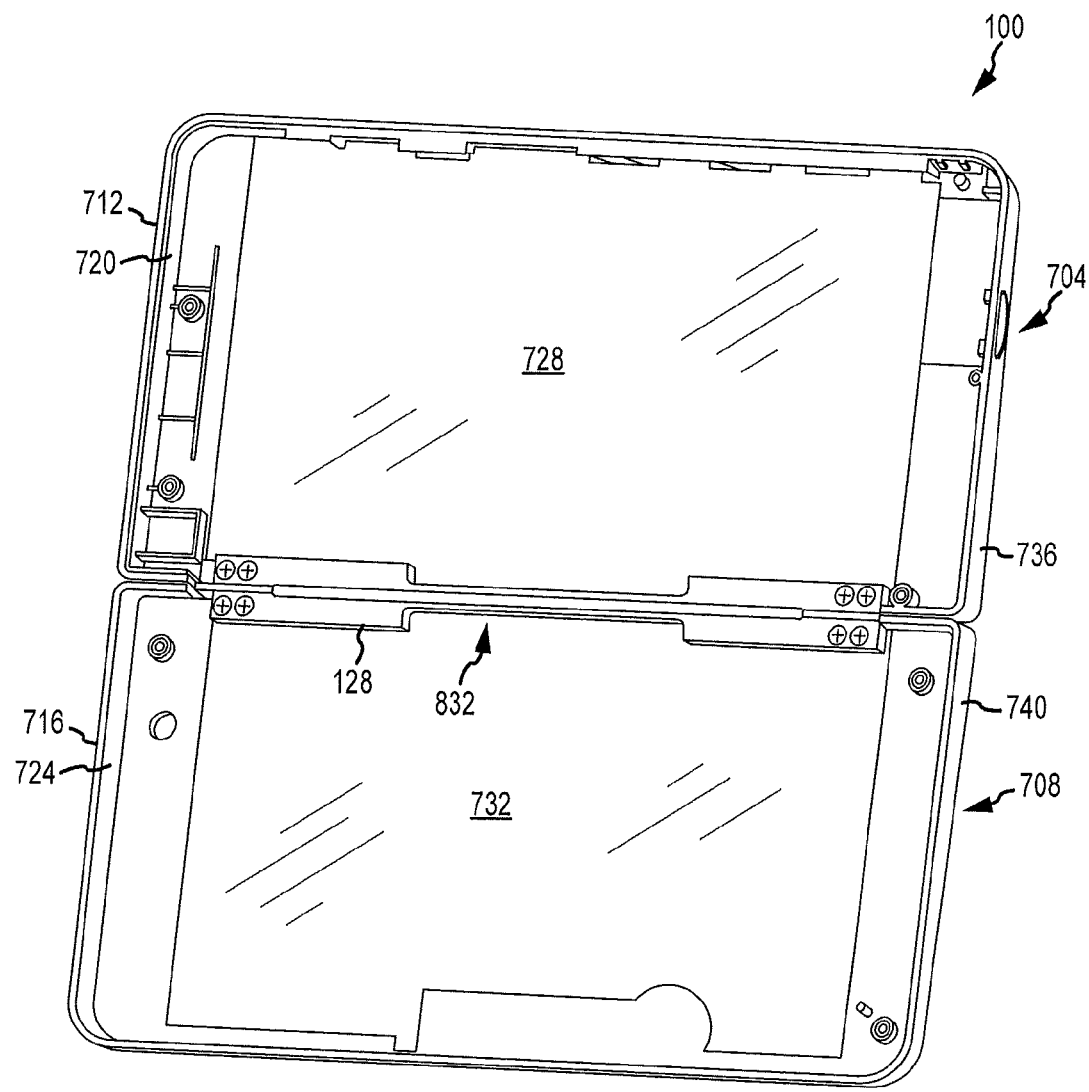
FIG. 7 is a perspective view of an embodiment of a first housing and second housing of a multi-screen device.
Figure 8A:
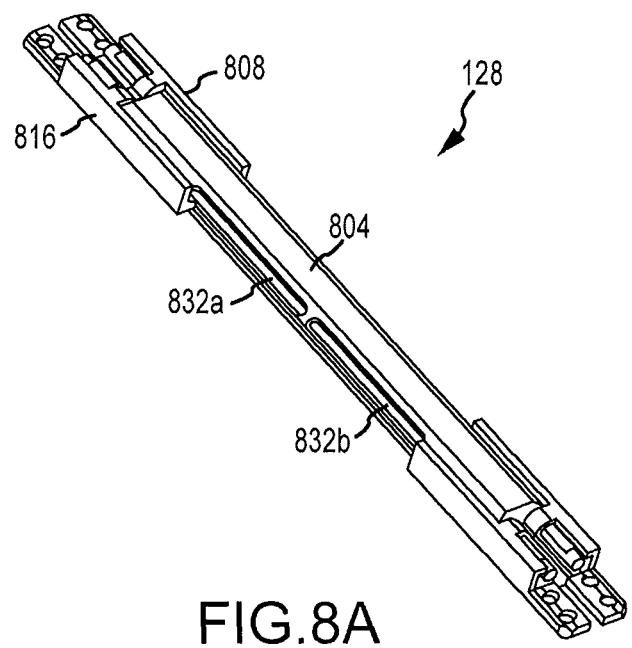
FIGS. 8A-I are views of an embodiment of a hinge with example dimensions.
Figure 8B:
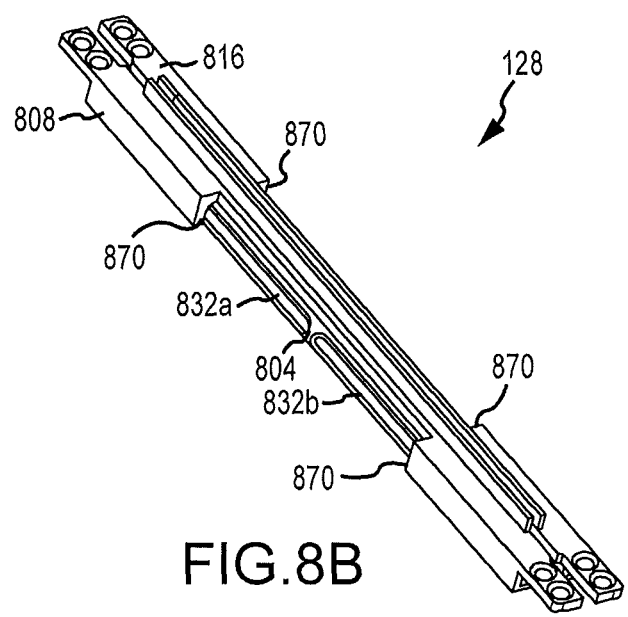
Figure 8C:
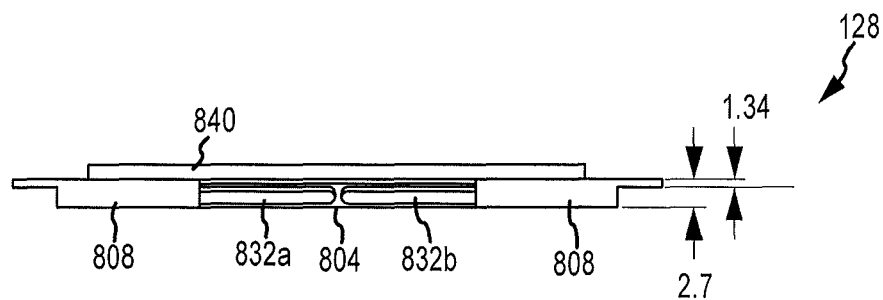
Figure 8D:
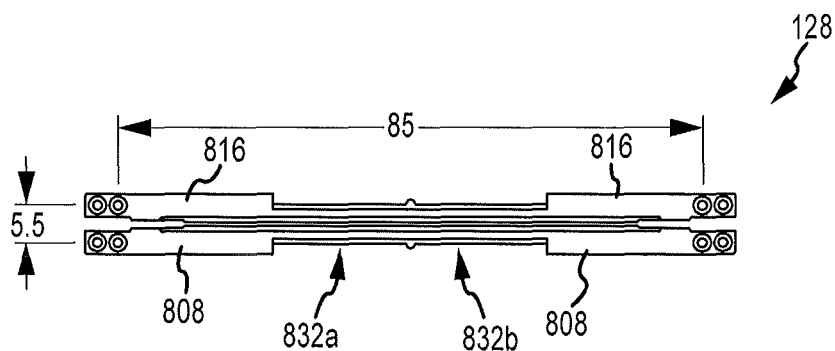
Figure 8E:
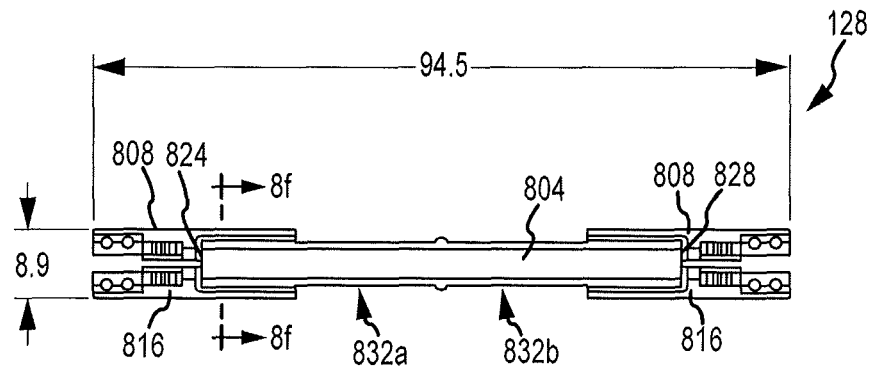
Figure 8F:
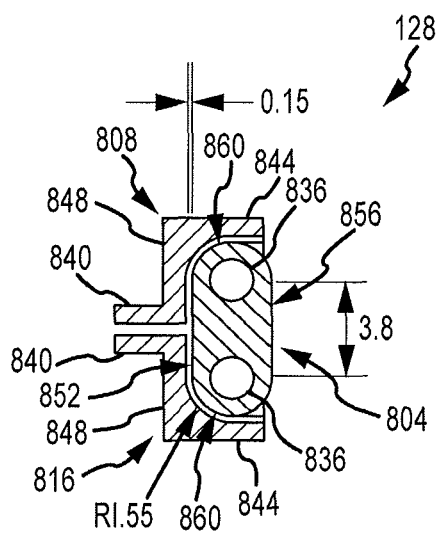
Figure 8G:
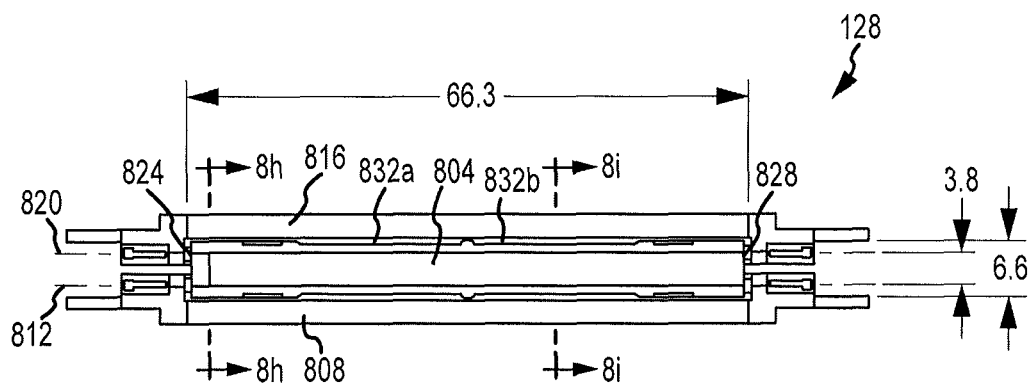
Figure 8H:
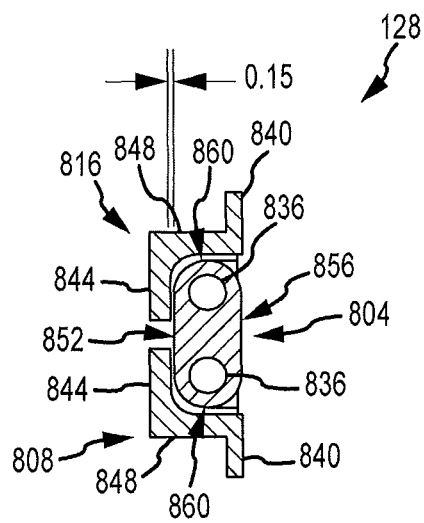
Figure 8I:
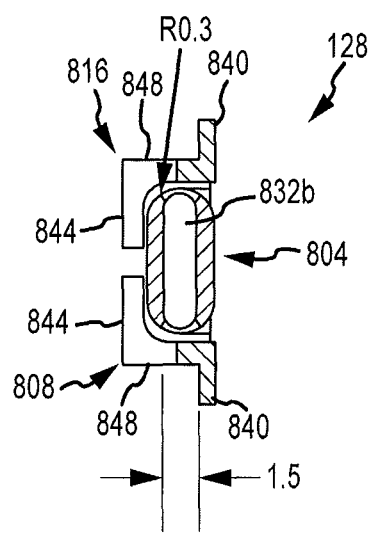

Referring to FIG. 7, an embodiment of a first and second housing 704 and 708 of a multi-screen device 100 is illustrated. In embodiments, the first housing 704 forms part of the first screen 104, and the second housing 708 forms part of the second screen 108. The housings 704 and 708 generally are configured to protect the internal components of the device 100 while minimizing the overall thickness of each of the screens 104 and 108.

In embodiments, the first screen 704 is rotatably connected to the second screen 708. For example, a hinge 128 may be connected to the first screen 704 so that the screen 704 is rotatable about a first axis. The hinge 128 also may be connected to the second screen 708 so that the screen 708 is rotatable about a second axis. The hinge 128 may be at least partially disposed within an opening formed in a side surface, a side, or a sidewall, of the first and second screens 704 and 708.

Referring to FIGS. 8A-I, an embodiment of a hinge 128 is provided. In embodiments, the hinge 128 has two distinct pivot axes. For example, the hinge 128 may include a hub 804, a first leaf 808 rotatably connected to the hub 804 about a first pivot axis 812, and a second leaf 816 rotatably connected to the hub 804 about a second pivot axis 820. In embodiments, the hinge 128 has a range of motion of at least about 180 degrees so that the device is foldable between an open position in which the first and second screens 104 and 108 are juxtaposed in substantially the same plane, as shown in FIGS. 1C-1F, and a closed position in which the first and second screens 108 and 108 are oriented substantially back-to-back in adjacent planes, as shown in FIG. 1H. In one embodiment, the first and second leaves 808 and 816 each may have a range of motion of at least 90 degrees between an open position and a closed position.

In embodiments, the hinge 128 is configured to minimally impact the size, or outer envelope, of the device 100. For example, referring to FIGS. 1C-1F, when the device 100 is in an open position, the hinge 128 may be substantially disposed within an outer envelope of the device 100. Stated differently, the hinge 128 may be configured to not protrude from the front, rear, or exposed sides of the device 100. In embodiments, when the device 100 is in the open position, the hinge 128 may be substantially flush with the rear surfaces of the first and second screens 104 and 108. Referring now to FIG. 1H, when the device 100 is in the closed position, the hinge 128 may be substantially disposed within an outer envelope of the device 100. Stated differently, the hinge 128 may be configured to not protrude from the front or exposed sides of the device 100. In embodiments, when the device 100 is in the closed position, the hinge 128 may be substantially flush with the side surfaces 188d of the first and second screens 104 and 108.

Figure 9:
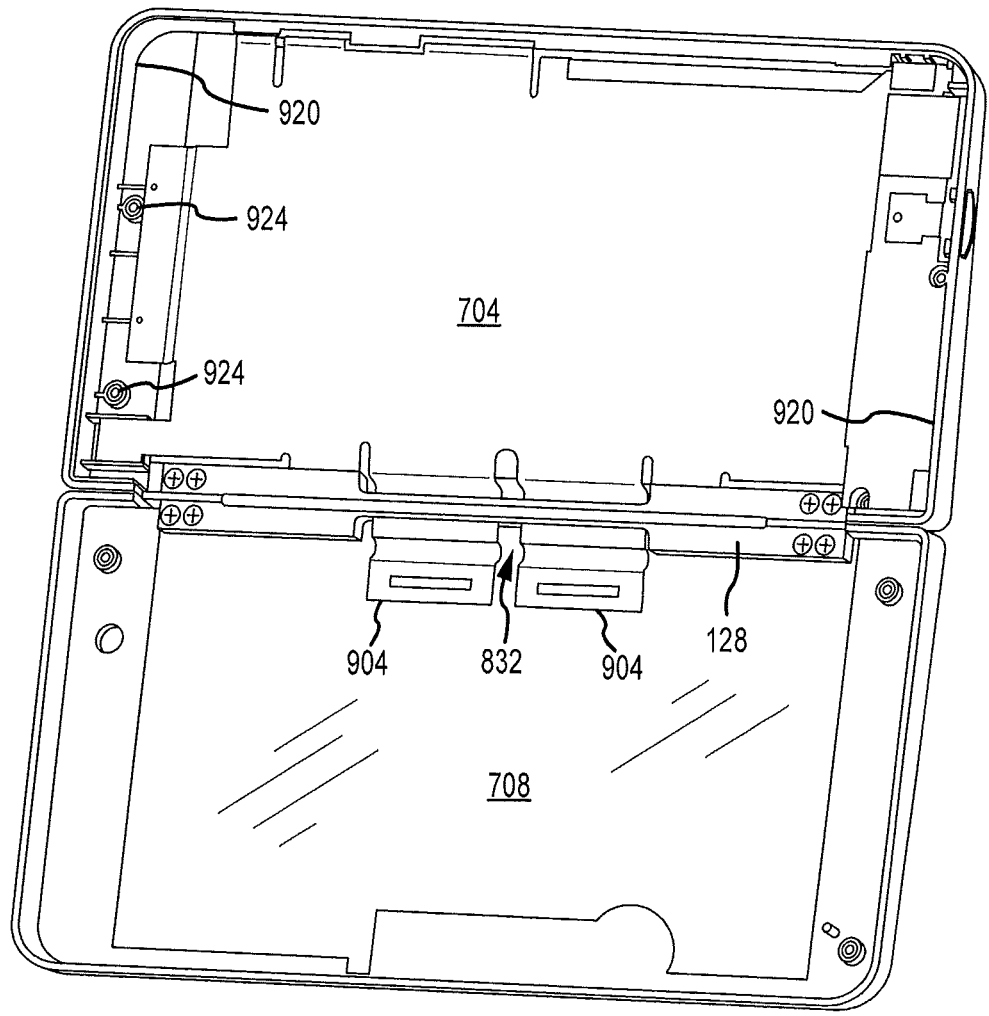
FIG. 9 is a perspective view of an embodiment of a first and second housing of a multi-screen device with a flexible circuit passing through an internal passage of the hinge.

Referring back to FIGS. 8A-I, the hub 804 may be configured to allow the electrical coupling of the first and second screens 104 and 108. For example, in embodiments the hub 804 is elongate and extends between a first end 824 and a second end 828. The hub 804 may include at least one internal passage 832 positioned between the first and second ends 824 and 828. The at least one internal passage 832 may extend transverse to the first and/or second pivot axes 812 and 820. In one embodiment, the hub 804 includes two internal passages 832a, b. The at least one internal passage 832 may be configured to accommodate at least one electrical wire through the hub 804. In one embodiment, an electrical ribbon or flexible circuit may pass through the at least one internal passage 832 to electrically couple the first and second screens 104 and 108. In alternative embodiments, a plurality of shorter hubs 804 may be utilized. For example, in one embodiment, two hubs 804, each containing a single internal passage 832, may be utilized. Referring to FIG. 9, one embodiment of a flexible circuit 904 is shown passing through an internal passage 832 of the hinge 128 to electrically couple the first and second screens 104 and 108.

Referring back to FIGS. 8A-I, the leaves 808 and 816 may be rotatably connected to the ends 824 and 828 of the hub 804. For example, in one embodiment, each end 824 and 828 of the hub 804 includes holes 836 having centerlines generally corresponding to the first and second pivot axes 812 and 820. A pin may be associated with the holes 836 to connect the leaves 808 and 816 to the hub 804. In alternative embodiments, the hub 804 may include integrally formed protrusions or rods extending from the ends 824 and 828 and configured for connection to holes formed in the leaves 808 and 816.

The leaves 808 and 816 may each be formed as a single component that connects to both ends 824 and 828 of the hub 804, as depicted in FIGS. 8A-I. In this embodiment, a middle portion of each of the leaves 808 and 816 may include a void configured not to interfere with electrical components, such as wires, passing through the hub 804, especially during rotation of the device 100 between an open and closed position. The leaves 808 and 816 also may each include an open flange 840 and a closed flange 844. In one embodiment, the open flanges 840 are substantially parallel to the closed flanges 844 but extend in opposite directions relative to a base 848 of each leaf 808 and 816. In operation, the first and second leaves 808 and 816 may be rotatable about opposing sides of the hub 804. For example, in one embodiment the hub 804 has a substantially flat front and rear surfaces 852 and 856 connected to each other by opposing side surfaces 860, which may be substantially semi-circular. In this embodiment, the leaves 808 and 816 may each have a substantially semi-circular inner surface positioned adjacent to one of the opposing side surfaces 860 of the hub 804. During rotation of the leaves 808 and 816 between an open and closed position, the leaves 808 and 816 may rotate about the pivot axes 812 and 820 around the side surfaces 860 of the hub 804.

When the device 100 is in an open position, the open flanges 840 of the leaves 808 and 816 may be substantially parallel to one another and substantially abut each other to prevent further rotation of the screens 104 and 108. In one embodiment, the hinge 128 is configured so that the screens 104 and 108 are rotatable beyond a planar configuration. In this embodiment, the hinge 128 is configured to permit the screens 104 and 108 to rotate slightly beyond planar so that an inner edge of each screen 104 and 108 disposed on a front surface of the respective screen can be positioned adjacent to the opposing screen edge in a substantially abutting relationship to close any gap existing between the screens 104 and 108 when positioned in a planar configuration.

Figure 16:
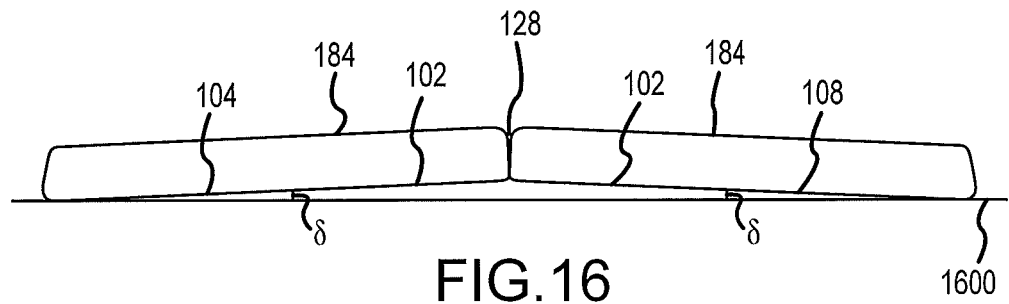
FIG. 16 is a side view of the device according to an embodiment.
Figure 17:
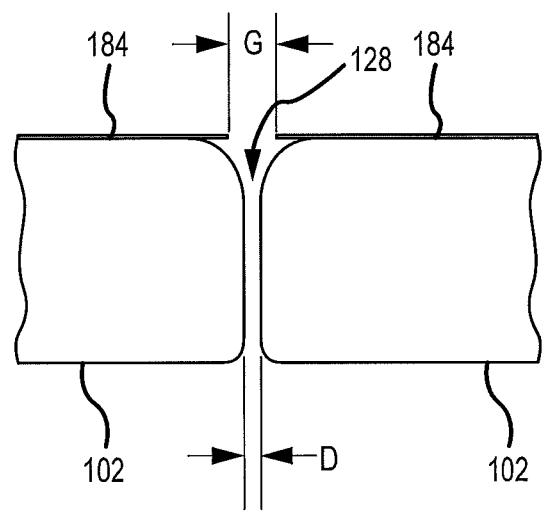
FIG. 17 is an enlarged view of the first and second screen assemblies according to an embodiment.

This configuration is shown in FIGS. 16 and 17. As shown in FIG. 17, planes of the front surfaces 102 of the first and second screens 104 and 108 are substantially transverse, or non-parallel, to one another and each forms an angle δ with a substantially horizontal plane 1600 typically of no more than about 10°, more typically of no more than about 5°, more typically of no more than about 1.0°, and even more typically of no more than about 0.5°. The over-rotation or over-travel of the hinge 128 enables, with reference to FIG. 17, an inter-housing distance "D" between adjacent front facing interior edges of the first and second housings 704 and 708 (and/or between the first and second touch screen displays 110 and 114 and/or between the first and second screens 104 and 108) proximal to the hinge 128 typically of no more than about 10 mm, even more typically of no more than about 5 mm, even more typically of no more than about 1 mm, more typically of no more than about 0.5 mm, and even more typically of no more than about 0.25 mm. In this way, there is substantially no visible inter-screen gap or seam "D" spanning the device length "L" between the first and second screens 104 and 108 (FIG. 1E) when the device 100 is in the fully open position. A longitudinal gap "G", however, extends the length of the device between the rear surfaces 184, with the width of the gap "G" being larger than a width of the distance "D".

Figure 18:
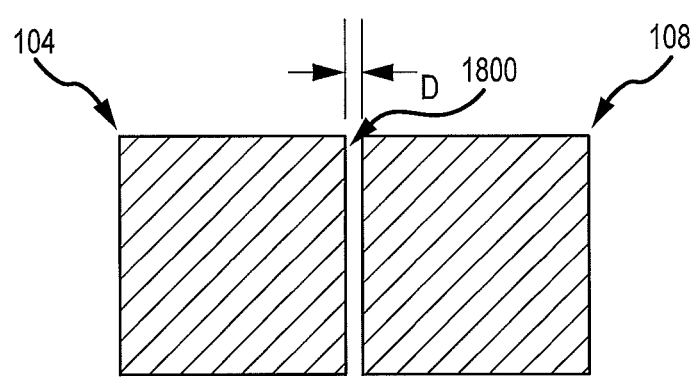
FIG. 18 is a top view of a section 1800 (FIG. 1B) according to an embodiment.

In one configuration, an active information display area in each of the first and second screens 104 and 108 is substantially continuous, or uninterrupted, over the inter-screen border or boundary. With reference to FIG. 18, the thatched area indicates the portions of the first and second screens 104 and 108 that provide displayed images, such as video and/or other graphical information, to the user. The black inter-display seam 1800 between the first and second screens 104 and 108 is substantially invisible to the viewer, in large part due to the small distance "D".

When the device 100 is in a closed position, the closed flanges 844 of the leaves 808 and 816 may be substantially coplanar in an abutting relationship with a front surface 852 of the hub 804. In this configuration, a rear surface 856 of the hub 804 may be exposed. In an alternative embodiment, the first and second leaves 808 and 816 may be separated into multiple components, each of which is associated with only one end 824 or 828 of the hub 804.

The hinge 128 can be compact and incorporated into the body of the device 100, thereby substantially minimizing the inter-screen gap or seam between the juxtaposed screens. The hinge, as noted, can allow over-travel, or rotation beyond 180 degrees. The hinge over-travel can allow the first and second screens 104 and 108 to touch or contact physically when the device 100 is fully opened, thereby essentially eliminating any gap or seam between the first and second screens 104 and 108.

As will be appreciated, other appropriately configured hinge configurations having one or multiple pivot axes may be employed that can also provide similar gap or seam minimization. Internal or external hinges can equally provide inter-display seam minimization. Bulkier hinges (resulting in a larger gap between the first and second screens 104 and 108) with more hinge over-travel (to compensate for the larger inter-screen gap) can be used, for example. Examples of suitable hinges include barrel hinge, pivot hinge, butt/mortise hinge, case hinge, continuous or piano hinge, concealed hinge, butterfly hinge, flag hinge, strap hinge, H hinge, HL hinge, counterflap hinge, flush hinge, coach hinge, rising butt hinge, double action spring hinge, Tee hinge, fraction hinge, security hinge, cranked hinge, lift-off hinge, self-closing hinge, butt hinge, butler tray hinge, card table hinge, and drop leaf table hinge.

Figure 10:
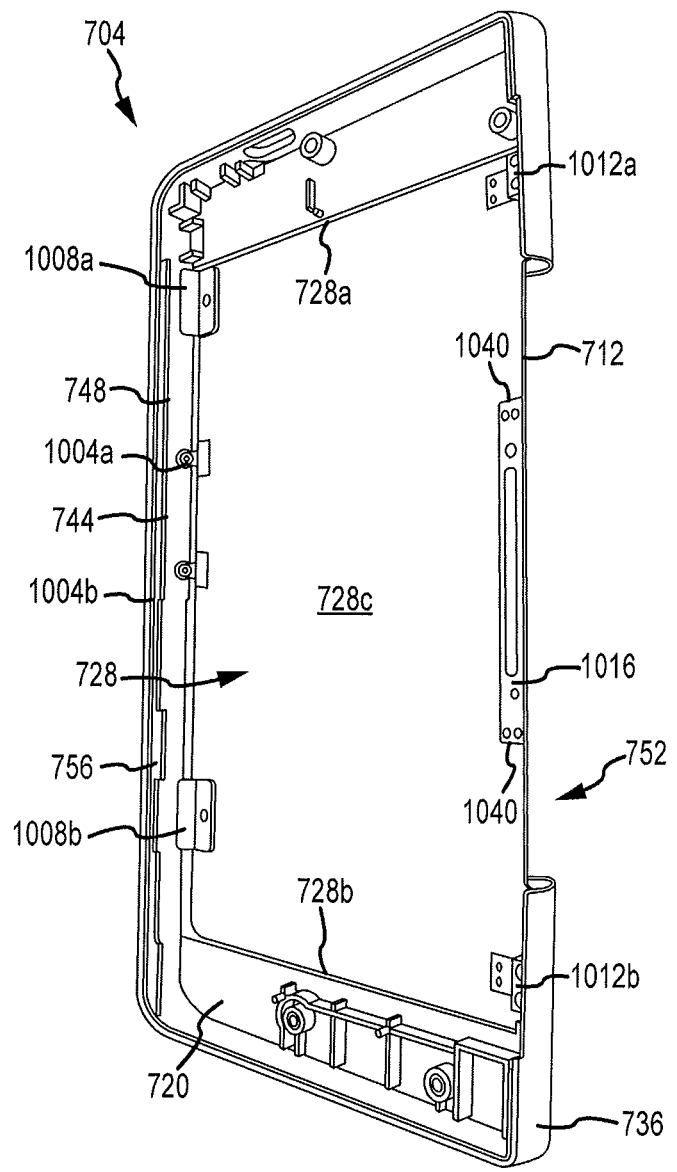
FIG. 10 is a view of an embodiment of a first housing.
Figure 12:
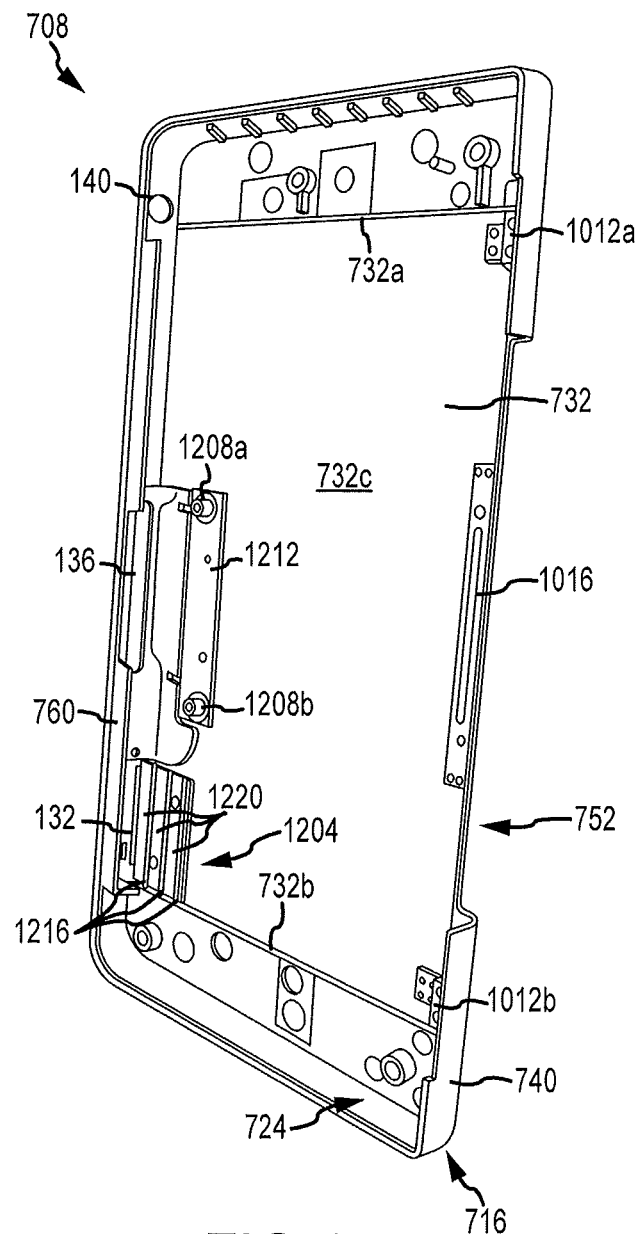
FIG. 12 is a perspective view of a second housing.

Referring now to FIGS. 10 and 12, each housing 704 and 708 may include an opening 752 formed in a side surface or sidewall 736. When the device 100 is in the open position, the opening 752 formed in each housing 704 and 708 may substantially oppose each other, as shown in FIG. 7. Each opening 752 may be configured to accommodate at least a portion of the hinge 128. For example, in one embodiment the hinge 128 is at least partially positioned within the opening 752 of the first and second housings 704 and 708. In one specific example, the first leaf 808 may be substantially positioned within the first housing 704 and the second leaf 816 may be substantially positioned within the second housing 708. In this embodiment, the hub 804 may be the only component of the hinge 128 that extends between the screens 104 and 108. By connecting the first leaf 808 to the first housing 704 and the second leaf 816 to the second housing 708, the first screen 104 may be rotatable about the first axis 812 and the second screen 108 may be rotatable about the second axis 820.

Referring to FIGS. 7 and 9, in embodiments each housing 704 and 708 includes an outer shell 712 and 716 and a polymeric portion 720 and 724, respectively. The outer shells 712 and 716 may provide a durable case for the device 100. The polymeric portions 720 and 724 may provide rigidity to selective locations of the outer shell 712 and 716, respectively. In one embodiment, each outer shell 712 and 716 is metallic.

In embodiments, the outer shell 712 and 716 includes a base 728 and 732 and a sidewall 736 and 740, respectively. The base 728 and 732 may be formed in different shapes and/or curvatures. In one embodiment, the base 728 and 732 of each housing is substantially flat and provides a rear surface datum for the internal components of the device 100. The sidewall 736 and 740 may connect to a periphery of the base 728 and 732, respectively. In one embodiment, the base and sidewall of each housing 704 and 708 are integrally formed from a single component, such as sheet metal.

In embodiments, the outer shell 712 and 716 of each housing 704 and 708 includes an inner surface and an outer surface. The inner surface generally faces the interior of the device 100, and the outer surface generally faces the exterior of the device 100. In embodiments, the polymeric portion 720 and 724 is overmolded on the inner surface of the outer shell 712 and 716, respectively, in selective locations to provide rigidity to predetermined areas of the outer shell. In the depicted example, the polymeric portion 720 and 724 of each housing 704 and 708 is overmolded on opposite end portions of the base 728 and 732, respectively. Also depicted, the polymeric portion 720 and 724 may be overmolded on the inner surface of the sidewall 736 and 740, respectively.

In embodiments, the polymeric portion 720 and 724 is nanomolded on the outer shell 712 and 716 of the housings 704 and 708, respectively. In one embodiment, selective locations of the outer shell 712 and 716 of each housing 704 and 708 is etched with a chemical, and then the polymeric portion 720 and 724 is overmolded on the etched metallic outer shell to provide a strong, resilient bond between the polymeric portions and outer shells. In this fashion, the polymeric portions 720 and 724 can be selectively connected to the outer shell 712 and 716 of the housings 704 and 708, respectively, to provide rigidity to the housings 704 and 708 and enable the housings 704 and 708 to utilize a thin back 728 and 732, thereby reducing the overall thickness of the first and second screens 104 and 108.

The thickness of the outer shell 712 and 716 of each housing 704 and 708 may be selectively dimensioned to reduce the weight and thickness of the device 100. In embodiments, the thickness of the outer shell 712 and 716 of each housing 704 and 708 is less than about 10 millimeters, preferably less than about 5 millimeters, and more preferably less than about 3 millimeters. In one embodiment, the thickness of the metallic outer shell 712 and 716 of each housing 704 and 708 is about 3 millimeters. In this embodiment, the outer shell 712 and 716 may be undesirably deformable in certain locations. As discussed above, a polymeric portion 720 and 724 may be molded to the outer shell 712 and 716 to provide rigidity to selective locations of the outer shell. In addition, as discussed below, other components may be connected to the outer shell 712 and 716 in selective locations to provide rigidity to the outer shell 712 and 716.

The outer shells 712 and 716 and the polymeric portions 720 and 724 may comprise materials commonly utilized in the art. In embodiments, the outer shells 712 and 716 is metallic and may comprise any metal or alloy known in the art. In one embodiment, the outer shell 712 and 716 of each housing 704 and 708 comprises a 304 stainless steel, ¾ hardened. In embodiments, the polymeric portions 720 and 724 comprise any polymeric material known in the art, including thermoplastic and/or thermosetting polymers. In one embodiment, the polymeric portion 720 and 724 of each housing 704 and 708 comprises a polyphenol plastic.

With reference to FIG. 10, an embodiment of a first housing 704 is provided. The first housing 704 includes a metallic outer shell 712 and a polymeric portion 720 molded to an inner surface of the outer shell 712. The outer shell 712 includes a substantially flat base 728 and a sidewall 736 integrally connected to a periphery of the base 728. The base 728 has a top portion 728a (covered by the polymeric portion), a bottom portion 728b (covered by the polymeric portion), and a middle portion 728c interposed between the top and bottom portions 728a and 728b. The middle portion 728c is exposed, i.e., not covered by the polymeric portion 720, in the depicted example and generally is dimensioned to accommodate a battery for powering the device 100. Accordingly, in this embodiment, the thickness of the outer shell 712 in the area corresponding to the battery can be minimized, thereby reducing the overall thickness of the device 100. Additionally, in this embodiment, the battery and other stacked components may provide rigidity to at least a portion of the exposed middle portion 728c of the base 728.

In embodiments, the first housing 704 can include components selectively positioned and connected to the base 728 to provide additional rigidity to predetermined locations and/or features of the device 100. For example, in the depicted embodiment, a screw boss 1004, an L-shaped bracket 1008, a hinge block 1012, and a hinge reinforcement strip 1016 are connected to the base 728. The listed components can be connected to the housing 704 using any connection device and/or method known in the art, including laser welding.

In embodiments, the first housing 704 may include at least one screw boss 1004. The screw boss 1004 may be configured to connect a backing plate 1100, shown in FIGS. 11a-c, to the housing 704. In addition, the screw boss 1004 may be configured to selectively position the backing plate 1100 within the housing 704 relative to the base 728 and/or the sidewall 736. For example, the screw boss 1004 may be configured to position the backing plate 1100 a predetermined distance above the base 728 and/or in a predetermined orientation relative to the base 728. In one embodiment, the screw boss 1004 is configured to orient the backing plate 1100 in a substantially perpendicular orientation relative to the base 728. The screw boss 1004 also may be positioned a predetermined distance from the sidewall 736 to selectively locate the backing plate 1100 relative to the sidewall 736 for providing rigidity to at least one button and/or defining a datum for positioning at least one component, such as a battery, within the housing 704. In the depicted example, the first housing 704 includes two screw bosses 1004a, b connected to the base 728 proximate to the sidewall 736. The example screw bosses 1004a, b are spaced apart from each other by a predetermined distance so as to not interfere with the operation of the buttons 152 and 154, shown in FIGS. 1D-E, associated with the ports 744 and 748. In addition, the example screw bosses 1004, b each include a threaded aperture. In embodiments, a backing plate 1100 may be connected to the at least one screw boss 1004 with a threaded fastener configured to threadably engage the threaded aperture of the at least one screw boss 1004.

Figure 11A:
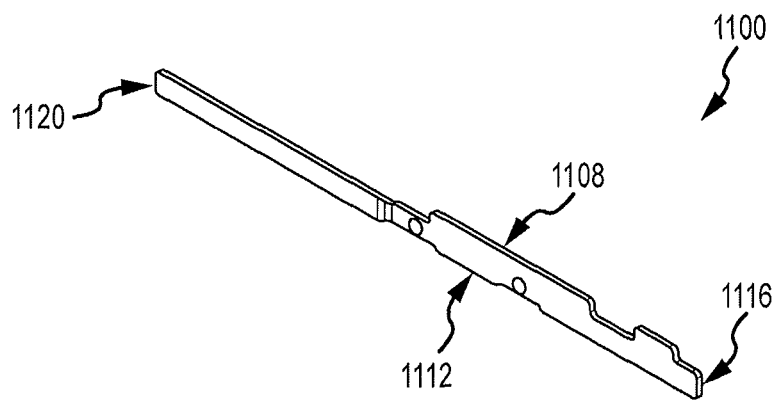
FIGS. 11A-C are views of an embodiment of a backing plate with example dimensions.
Figure 11B:
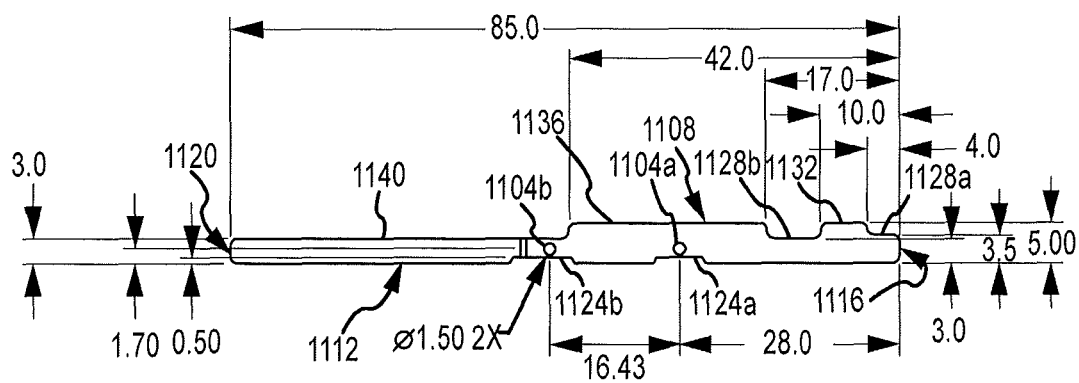
Figure 11C:
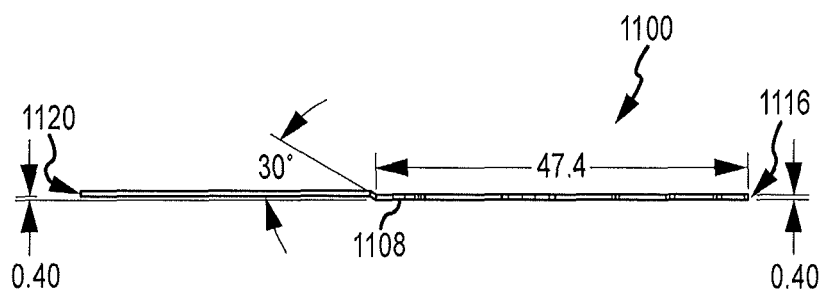

Referring to FIGS. 11A-C, one embodiment of a backing plate 1100 is provided. The example backing plate 1100 is configured to connect to the housing 704 to provide rigidity to a button and/or to define a datum for positioning a component, such as a battery, within the housing 704. The depicted backing plate 1100 includes two apertures 1104a, b spaced apart a predetermined distance to correspond to the threaded apertures of the screw bosses 804a, b. The example backing plate 1100 also includes a front edge 1108, a rear edge 1112, a top edge 1116, and a bottom edge 1120. When connected to the housing 704, the front edge 1108 of the backing plate 1100 may be positioned a predetermined height above the base 728, and the rear edge 1112 may be positioned adjacent to the base 728. In one embodiment, the front edge 1108 of the backing plate 1100 may be positioned below a shelf formed on a sidewall 736 of the housing 704. In addition, when connected to the housing 704, the top edge 1116 may be positioned proximate to a top side of the device 100. The backing plate 1100 may be positioned adjacent to a portion of the sidewall 738 having ports 744 and 748.

The backing plate 1100 may be configured to accommodate other components within the housing 704. For example, the example backing plate 1100 includes two recessed areas 1124a, b formed in the rear edge 1112 of the backing plate 1100 and disposed substantially below the apertures 1104a, b, respectively. The depicted recessed areas 1124a, b are configured to accommodate a base portion of the screw bosses 1004a, b, which may be connected to the base 728 of the first housing 704. In addition, the front edge 1108 of the backing plate 1100 may include several recessed areas as well. For example, proximate to the top edge 1116 of the backing plate 1100, the front edge 1108 of the example backing plate 1100 includes two recessed areas 1128a, b spaced apart from each other by a predetermined distance to define a raised portion 1132 interposed between the recessed areas 1128a, b. When the backing plate 1100 is connected to the first housing 704, the raised portion 1132 may be configured to provide rigidity to the rocker button 154, shown in FIGS. 1D-E. In addition, the recessed areas 1128a, b may be configured to accommodate depression of opposing sides of the rocker button 154, which may correspond to a volume rocker button with a volume up and a volume down side. The example backing plate 1100 also includes a raised portion 1136 extending substantially between the recessed area 1128b and the aperture 1104b. The raised portion 1136 may be configured to provide rigidity to the button 152, which is shown in FIG. 1E.

The backing plate 900 also may be configured to provide support for a flexible circuit. In embodiments, a flexible printed circuit is placed on the middle portion 728c of the first housing 704 beneath a battery. To ground the flexible printed circuit to a printed circuit board, at least a portion of the flexible printed circuit may be routable from beneath the battery to a position on a front side of the battery. For example, the example backing plate 1100 may include an elongate recessed area 1140 extending between the raised portion 1136 and the bottom edge 1120 of the backing plate 1100. The elongate recessed area 1140 may be configured to allow a flexible circuit to be bent over the front and/or rear edge 1108 and 1112 of the recessed area 1140. For example, in embodiments, the rear edge 1112 corresponding to the recessed area 1140 may be selectively positioned relative to the base 728 to define a predefined gap between the rear edge 1112 of the backing plate 1100 and the base 728. The predefined gap may be dimensioned to accommodate a thickness of a flexible circuit, and in at least one embodiment the rear edge 1112 of the backing plate 1100 may substantially clamp the flexible circuit to the base 728. In addition, the front edge 1108 associated with the recessed area 1140 may provide a path for positioning the flexible circuit. The distance between the sidewall 736 and the bottom portion of the backing plate 1100 associated with the recessed area 1140 may be dimensioned to accommodate a predetermined bending radius of the flexible circuit. In this configuration, the rear edge 1112 of the backing plate 1100 may secure the flexible printed circuit in a predetermined position beneath the battery while the front and rear edges 1108 and 1112 may provide a reference for the flexible printed circuit to be bent around to ensure a proper bend radius.

Referring back to FIG. 10, the first housing 704 may include two L-shaped brackets 1008a, b connected to the base 728 proximate to the sidewall 736. More specifically, the L-shaped brackets 1008a, b may be connected to the base 728 proximate to a side of the sidewall 736 that includes ports 744 and 748 which may be configured to accommodate a button 152 and a rocker button 154. The L-shaped brackets 1008a, b may be configured to provide rigidity to the top and bottom portions of the backing plate 1100 associated with the top and bottom ends 1116 and 1120. The L-shaped brackets 1008a, b may be connected to the backing plate 1100. In one embodiment, the L-shaped brackets 1008a, b are dimensioned to extend above the base 728 a predetermined distance so that a front edge of the L-shaped brackets 1008a, b is substantially flush with the front edge 1108 of the backing plate 1100.

When connected to the base 728 of the first housing 704, the backing plate 1100 and/or L-shaped brackets 1004a, b may define a datum configured to position a battery on the middle portion 728c of the base and/or provide rigidity to buttons 152 and 154 associated with the sidewall 736. For example, in embodiments the backing plate 1100 is configured to maintain consistent button behavior for the buttons associated with the sidewall 736, and, if a rocker button is included, the backing plate 1100 can provide fields for the rocker button, such as up, down, and/or mute. In addition, the configuration of the backing plate 1100, the L-shaped brackets 1008a, b, and/or the screw bosses 1004a, b may minimize space usage within the first housing 704, which may result in a first housing 704 with a reduced outer envelope.

Still referring to FIG. 10, the example first housing 704 includes two hinge blocks 1012a, b connected to the base 728 and the sidewall 736. In the depicted example, the hinge blocks 1012a, b are positioned adjacent to opposing ends of an elongate opening 752 formed in one side of the sidewall 736. The elongate opening 752 is configured to accommodate at least a portion of a hinge 128. The hinge blocks 1012a, b may each include threaded holes configured to engage a fastener and secure the hinge 128 to the first housing 704. Between the hinge blocks 1012a, b and near a middle portion of the elongate opening 752, a reinforcement strip 1016 can be connected to the base 728 to reinforce the base 728 near the opening 752 and to contact a body of the hinge 128 adjacent the internal passages 832a,b. The steps 870 in the hinge 128 body engage the opposing ends 1040 of the reinforcement strip 1016.

The backing plate 1100, the screw bosses 1004a, b, the L-shaped brackets 1008a, b, hinge blocks 1012a, b, and the hinge reinforcement strip 1016 may comprise materials commonly utilized in the art, including metallic and/or non-metallic materials. In embodiments, the backing plate 1100 comprises 304 stainless steel, ¾ hardened, with a thickness of approximately 0.4 millimeters. In embodiments, the screw bosses 1004a, b comprise 304 stainless steel, ¾ hardened. In embodiments, the L-shaped brackets 1008a, b comprise 304 stainless steel, ¾ hardened, with a thickness of approximately 0.3 millimeters. In embodiments, the hinge blocks 1012a, b comprise 316 stainless steel. In embodiments, the hinge reinforcement strip 1016 comprises 304 stainless steel, ¾ hardened.

With reference to FIG. 12, an embodiment of a second housing 708 is provided. Similar to the first housing 704, the second housing 708 includes an outer shell 716 and a polymeric portion 724 molded to an inner surface of the outer shell 716. The outer shell 716 includes a substantially flat base 732 and a sidewall 740 connected to a periphery of the base 732. The base 732 has a top portion 732a (covered by the polymeric portion), a bottom portion 732b (covered by the polymeric portion), and a middle portion 732c interposed between the top and bottom portions 732a and 732b. The middle portion 732c is exposed, i.e., not covered by the polymeric portion 724, in the depicted example and may be dimensioned to accommodate a printed circuit board. In embodiments, the polymeric portions 720 and 724 and/or other components may be configured to ensure the backs 728 and 732 of the shells 712 and 716 retain a predefined flatness and resist deformation, such as torsional and/or bending.

The polymeric portions 720 and 724 may be configured to include additional features. For example, bosses may be formed in the polymeric portions 720 and 724. The bosses may be configured to engage other components, and in one embodiment the bosses include threaded inserts configured to threadably engage other components associated with the device 100. The example polymeric portions 720 and 724 each include four bosses, two of which correspond to the top portions 728a and 732a of the bases 728 and 732, and two of which correspond to the bottom portions 728b and 732b of the bases 728 and 732. In addition to the bosses, the polymeric portions 720 and 724 may include a shelf 756 and 760 extending inward from the sidewall 736 and 740 of the outer shell 712 and 716, respectively. The shelves 756 and 760 may be configured to connect to a display of the first and second screens 104 and 108.

In embodiments, the second housing 708 can include components selectively positioned and connected to the base 732 to provide additional rigidity to predetermined locations and/or features of the device 100. For example, in the embodiment depicted in FIG. 12, a corrugated stiffener 1204, a boss 1208, a load distribution plate 1212, a hinge block 1012, and a hinge reinforcement strip 1016 are connected to the base 732. The listed components can be connected to the housing 708 using any connection device and/or method known in the art, including laser welding.

The corrugated stiffener 1204 depicted in FIG. 12 is positioned proximate to the sidewall 740 and configured to provide rigidity to the second housing 708 proximate to a card slot 132 formed in the sidewall 740. The corrugated stiffener 1204 includes a series of ridges 1216 and troughs 1220. The ridges 1216 and troughs 1220 may be substantially parallel to one another. In addition, the ridges 1216 and troughs 1220 may be substantially parallel to a side of the sidewall 740 that includes a card slot 132. The corrugated stiffener 1204 may comprise materials commonly utilized in the art, including metallic and/or non-metallic materials. In one embodiment, the corrugated stiffener 1204 comprises 304 stainless steel, ¾ hardness.

Figure 13A:
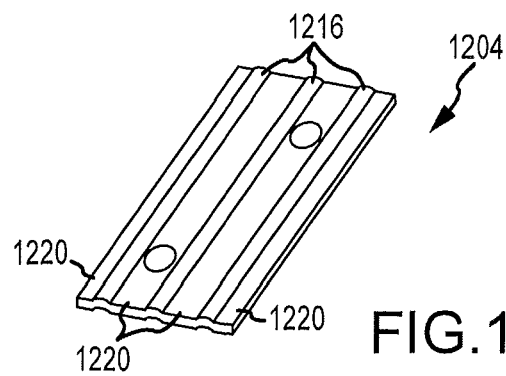
FIGS. 13A-C are views of an embodiment of a corrugated stiffener with example dimensions.
Figure 13B:
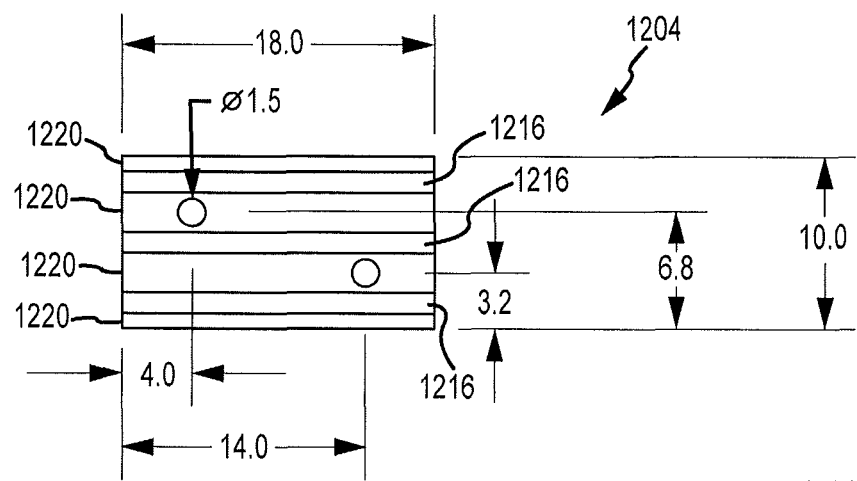
Figure 13C:
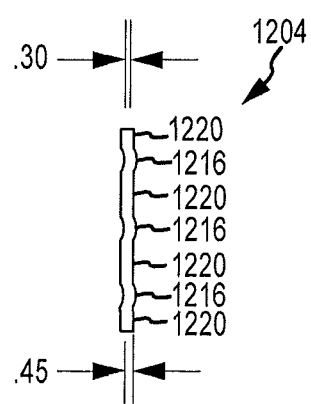

With reference to FIGS. 13A-C, an embodiment of the corrugated stiffener 1204 is provided. The example stiffener 1204 includes a series of parallel ridges 1216 and troughs 1220. In particular, the example stiffener 1204 includes 3 substantially parallel ridges 1216 and 4 substantially parallel troughs 1220. In embodiments, the series of ridges 1216 may have an uppermost portion that extends above an uppermost portion of the troughs 1220 by between about 5% and 95% of the thickness of the troughs 1220, preferably between about 25% and 75% of the thickness of the troughs 1220, more preferably between about 40% and 60% of the thickness of the troughs 1220, and even more preferably about 50% of the thickness of the troughs 1220. For example, in one embodiment, the series of troughs 1220 each have a thickness of about 0.3 millimeters, and an uppermost portion of each ridge 1216 extends above an uppermost portion of each trough 1220 by a distance of about 0.15 millimeters. In embodiments, the pitch, or the distance between the uppermost portions of the series of ridges 1216, is between about 2 millimeters and about 5 millimeters, preferably between about 3 millimeters and about 4 millimeters, and more preferably about 3.5 millimeters. In embodiments, the width of each ridge 1216 is between about 1 millimeter and about 3 millimeters, and preferably about 2 millimeters. In embodiments, the width of each trough 1220 is between about 0.5 millimeter and about 2.5 millimeters, and preferably about 1.5 millimeters. A trough 1220 may include an aperture, which may be utilized to position the corrugated stiffener 1204 relative to the sidewall 740.

The plurality of ridges 1216 and troughs 1220 may comprise various shapes. For example, in one embodiment, each ridge 1216 is arcuate and may be semi-circular. In one embodiment, each trough 1220 is substantially flat. In one embodiment, the uppermost portion of the series of ridges 1216 are coplanar and the uppermost portion of the troughs 1220 are coplanar.

The housing 708 may include at least one boss 1208 configured to connect a retainer bracket to the housing 708. Referring to the example housing depicted in FIG. 12, two bosses 1208 are selectively positioned and connected to the base 732 of the second housing 708. In embodiments, the bosses 1208 are spaced apart from each other by a predetermined distance so as to not interfere with a port 136 or devices associated with the port 136. In embodiments, the bosses 1208 are positioned apart from each other by a distance about equal to the width of the port 136. The example bosses 1208 are internally threaded and extend above the base 732 by a predetermined distance. For example, the bosses 1208 may extend above the base 732 by a distance approximately equal to a height of a printed circuit board. A load distribution plate 1212 may be positioned between the bosses 1208 and the base 732 to distribute any load transferred to the bosses 1208 to a larger area of the base 732 of the housing 708, thereby reducing localized deformation of the base 732. In embodiments, the load distribution plate 1212 is substantially rectangular. In embodiments, the load distribution plate 1212 can be formed from metallic and/or non-metallic materials. In one embodiment, the load distribution plate 1212 is formed from sheet metal.

Figure 14:
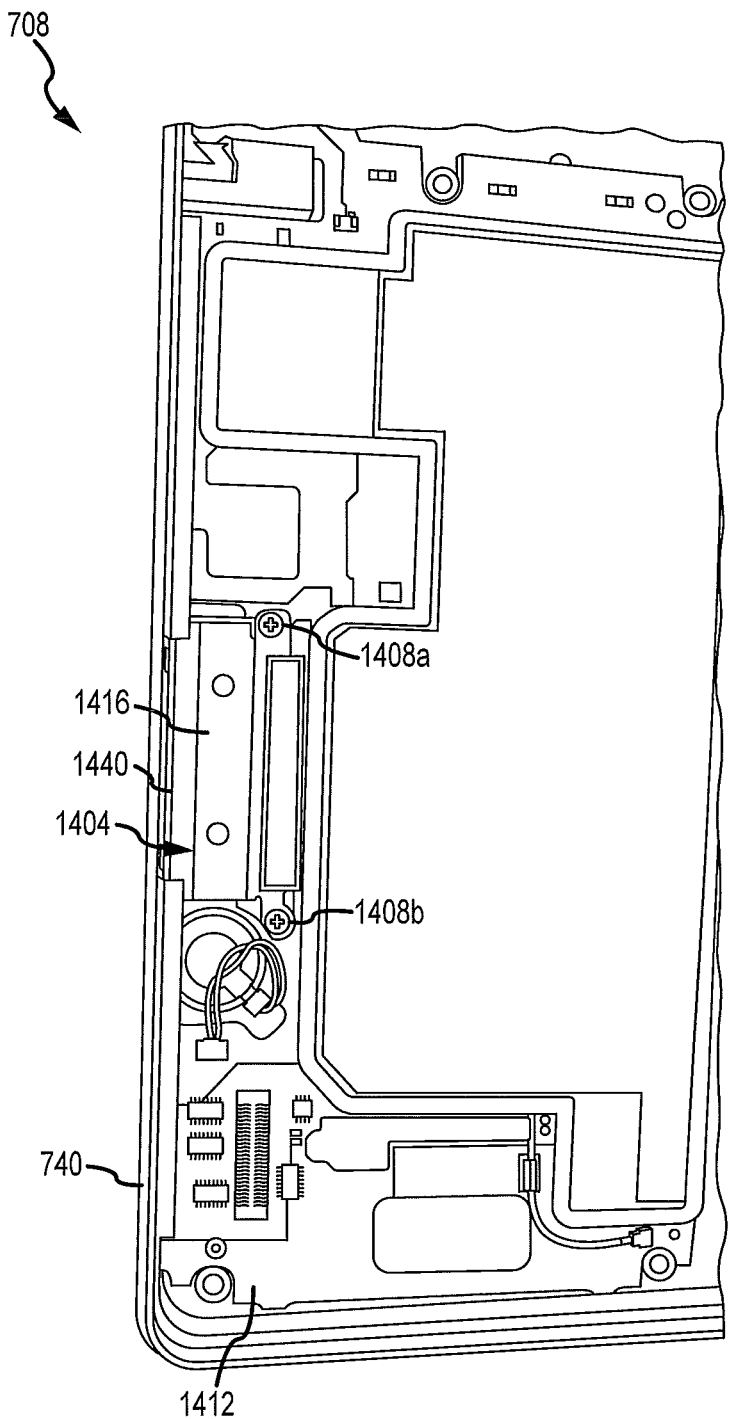
FIG. 14 is a perspective view of a second housing with an input/output retainer bracket.
Figure 15D:
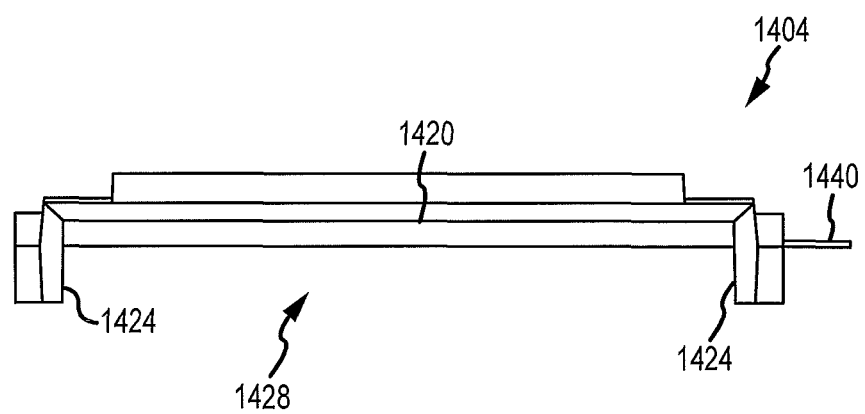

Referring to FIG. 14, an embodiment of a second housing 708 with internal components is provided. Particularly, an input/output (I/O) connector retainer bracket 1404 is positioned adjacent a port 136 that is formed in a sidewall 740 of the second housing 708. The retainer bracket 1404 is removably connected to the bosses 1208a, b with fasteners 1408a, b, respectively. The bosses 1208a, b may be positioned within cutouts of the printed circuit board. Thus, in one embodiment, the I/O connector retainer bracket 1404 is connected to the second housing 708 and does not connect to the printed circuit board.

In embodiments, the retainer bracket 1404 comprises a frame 1416 that defines an interior space configured to receive a dock connector, which in turn is configured to connect to a peripheral device. In embodiments, the frame 1416 is configured to secure the dock connector, which may be a female receptacle, between the frame 1416, the base 732, and the sidewall 740. In one embodiment, the frame 1416 is configured to at least partially enclose, or house, a dock connector. The frame 1416 may be configured to provide rigidity to the dock connector based at least in part on the connection of the frame 1416 to the housing 708. In addition, the dock connector may be movable relative to the frame. For example, in one embodiment, the frame 1416 may be configured to allow the dock connector to substantially float within an interior space of the frame 1416 to accommodate misalignments and/or other peripheral device connection issues. In one embodiment, a deformable material, such as a pressure sensitive adhesive, may be utilized to connect the dock connector to the frame 1416 while enabling the dock connector to move relative to the frame. In one embodiment, the dock connector is not connected to the frame 1416.

With reference to FIGS. 15A-D, an embodiment of an I/O connector retainer bracket 1404 is provided. The example retainer bracket 1404 comprises a frame 1416 having a top plate 1420 and opposing side plates 1424, which collectively may define an interior space 1428 of the frame 1416. As discussed previously, the frame 1416 may be configured to at least partially enclose a dock connector. Referring to FIGS. 15A-F, a dock connector may be at least partially positioned within the interior space 1428 of the frame 1416, and the top plate 1420 and opposing side plates 1424 may be configured to at least partially wrap around the dock connector. The dock connector may be connected to the frame 1416, and particularly to the top plate 1420 and/or the opposing side plates 1424, by various connection methods utilized in computing devices. For example, in one embodiment, a pressure sensitive adhesive may be utilized to connect the dock connector to the frame 1416. In some embodiments, the dock connector is not connected to the frame 1416. In these embodiments, the frame 1416 wraps around a top and side portion of the dock connector to substantially secure the dock connector between the frame 1416, the base 728 of the housing 708, and the sidewall 740 of the housing 708. The dock connector may be configured to be electrically coupled to a printed and/or flexible circuit board. In embodiments, the dock connector is a female receptacle configured to receive a male connector attached to a peripheral device.

The frame 1416 may include a connection plate configured to connect the frame 1416 to the housing 708. The example frame 1416 depicted in FIGS. 15a-f includes a connection plate 1432 having a plurality of apertures 1436a, b selectively positioned in the frame to geometrically align with the bosses 1208*a, b*. Thus, when the frame 1416 is positioned within the housing 708 adjacent to the port 136, the apertures 1436*a, b* align with the bosses 1208*a, b* for connecting the frame 1416 to the housing 708, and particularly to the base 732 of the housing 708. The connection plate 1432 may be substantially planar, as depicted in FIGS. 15A-D. In addition, the connection plate 1432 may be configured to contact an upper surface of the printed circuit board.

A substantial portion of the frame 1416 may be cantilevered between an edge of a printed circuit board and the sidewall 740 of the housing 708. In one embodiment, the frame 1416 includes a front edge 1440 configured to substantially abut an interior portion of the sidewall 740 of the housing 708, particularly an area of the sidewall 740 surrounding the port 136. As depicted in FIG. 14, the front edge 1440 of the frame 1416 is positioned in abutting relationship to the sidewall 740 of the housing 708. The I/O connector retainer bracket 1404 may comprise materials commonly utilized in the art, including metallic and/or non-metallic materials. In embodiments, the retainer bracket 1404 comprises a plastic material. In one embodiment, the retainer bracket 1404 comprises acrylonitrile butadiene styrene (ABS).

Referring back to FIG. 12, the example second housing 708 includes two hinge blocks 1012*a, b* and a hinge reinforcement strip 1016, all of which may be connected to the base 732. In the depicted example, the hinge blocks 1012*a, b* are positioned adjacent to opposing ends of an elongate opening 752 that is formed in one side of the sidewall 740. The elongate opening 752 may be configured to accommodate at least a portion of a hinge 128. The hinge blocks 1012*a, b* may each include threaded holes configured to engage a fastener and secure the hinge 128 to the second housing 708. Between the hinge blocks 1012*a, b* and near a middle portion of the elongate opening 752, a reinforcement strip 1016 can be connected to the base 728 to reinforce the base 728 near the opening 752.

Figure 19:
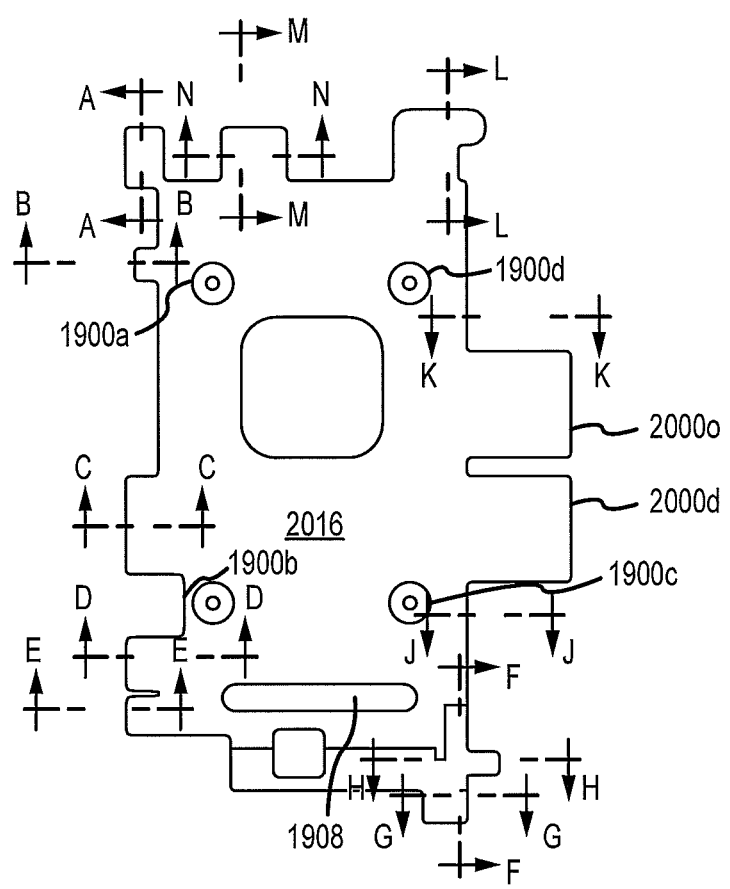
FIG. 19 is a plan view of a flexible electrically conductive member according to an embodiment.
Figure 23:
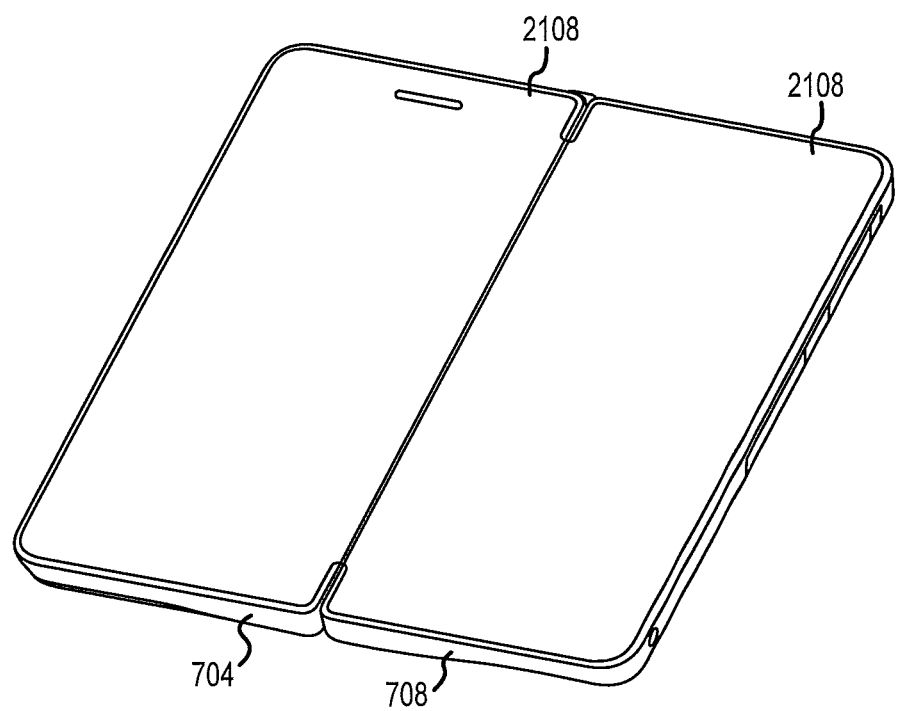
FIG. 23 is an isometric view of the device in the fully open position.
Figure 24:
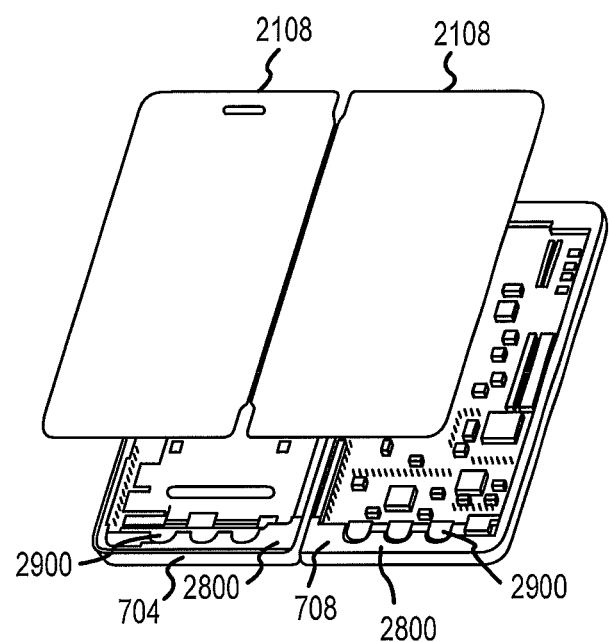
FIG. 24 is an exploded view of the device in the fully open position according to an embodiment.

FIGS. 19 and 20A-H and J-N are various views depicting a flexible electrically conductive member 1900 for electrically interconnecting an energy storage device, particularly a battery, with a printed circuit board to power the computational, processing, and display functions of the device 100. FIG. 19 depicts the member 1900 as configured when installed in the device 100. As will be appreciated, prior to installation the member 1900 is substantially planar and is folded into the depicted configuration during device assembly. Referring to FIG. 19, the member 1900 includes plural first conductive pads 1904*a-d* on a first surface of the member 1900 to contact conductive pads on a printed circuit board (not shown), plural second conductive pads 2004*j* and *k* (FIGS. 20J-K) to contact terminals of the energy storage device, an elongated passage 1908 for a flexible circuit (not shown) to the display (not shown), and plural tabs shown in FIGS. 20A-H and J-N for engaging selected features in the respective one of the first and second housings 704 and 708. FIGS. 20A-H and L-N depict various tab 2000*a-h* and 1-*n* configurations, respectively, used for locating the member 1900 in the device 100 relative to other components and/or electrically contacting selected components to the energy storage device. Tabs 2000*a, c, d, e, f, g, l, m* and *n* include conductive pads 2004 *a, c, d, e, f, g, l, m,* and *n*, respectively. Referring to FIGS. 20J-K, the tabs fold around the energy storage device, which typically is a rectangular-shaped battery, such that the energy storage device is received in the enclosed area 2008 and 2012 (for FIGS. 20J-K, respectively) to enable the contact pads 2004*j-k* to contact terminals of the energy storage device, which battery terminals are located on an opposing side of the energy storage device from the side of the energy storage device contacting the central portion 2016 of the member 1900. Tabs 2000*o* and *p* pass under and engage the reinforcement strip 1016.

FIGS. 21A-B, 22A-H, and 23-24 are various views depicting a substantially planar display frame 2100 that engages a rear surface of the display panel 2108 to provide structural support to the display panel and mechanically hold and retain the display panel in position. As will be appreciated, the display panel 2108 faces outwardly and the display frame 2100 inwardly relative to the respective one of the first and second housing. The display frame 2100 includes various features, including first, second, and third tabs 2104 *a,b,c* and lip 2116 to engage and mechanically interlock with a matching slot in a peripheral edge of the respective one of the first and second housings 704 and 708, score marks 2112 to locate a flexible circuit (not shown) from the printed circuit board (not shown) to the display 2108 and a cutout 2108 to pass a flexible printed circuit, thereby enabling the flexible circuit to bend to connect to the display panel. The display frame design can provide for mechanical retention of the display without external screws or clips increasing the outer dimensions of the housing. Additionally, the design can be substantially free of adhesives between the display panel and display frame and thereby avoiding the display frame from separating from the display panel, due to failure of the adhesive. The display frame 2100 is typically made from a non-magnetic material, such as stainless steel, to provide an electromagnetic shield or barrier, thereby preventing or inhibiting substantially all of the electromagnetic radiation from the electrical components in the printed circuit board and other electrical components positioned on a first side of the display frame from passing through the display frame 2100 and impacting adversely the operation of the display panel 2108 positioned on a second side of the display frame.

Figure 25:
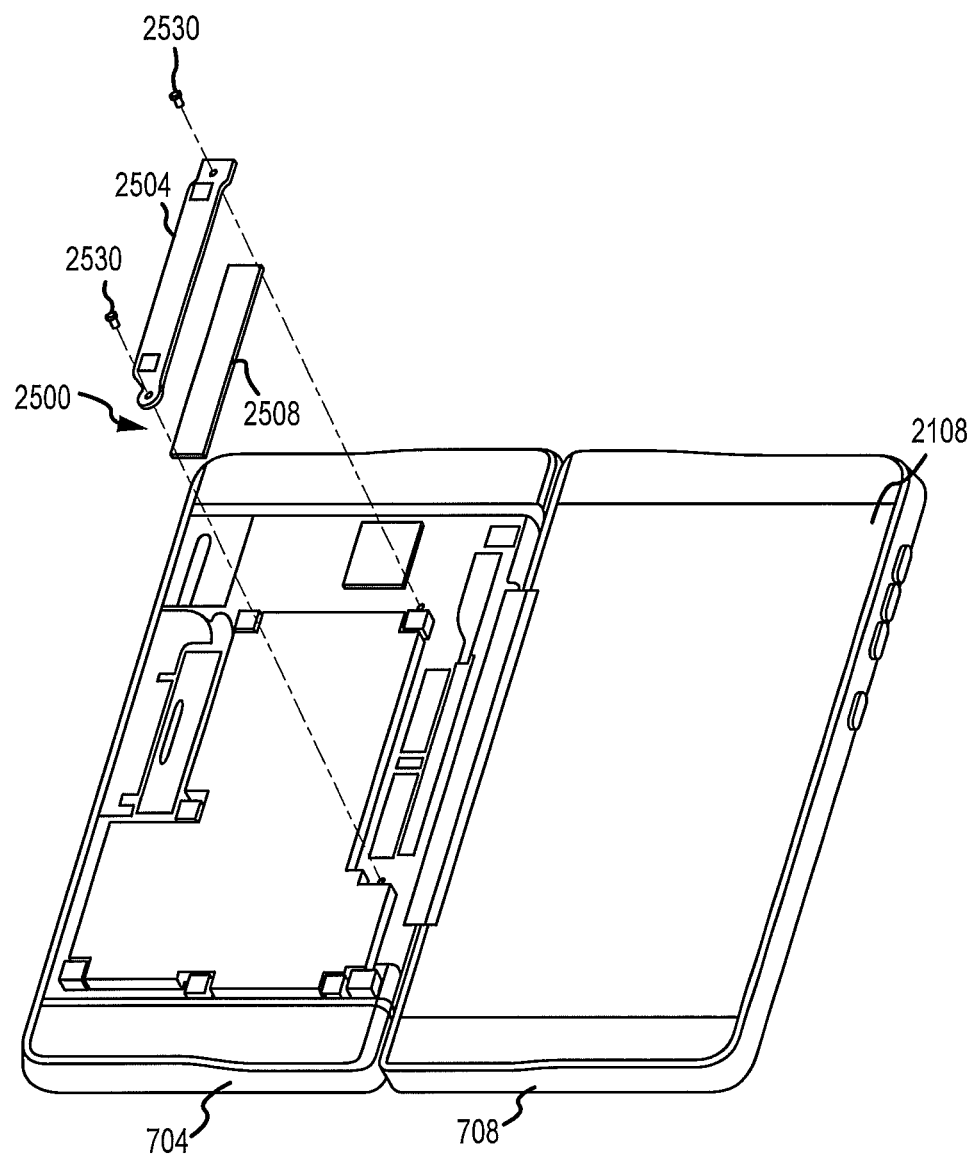
FIG. 25 is an exploded view of the device in the fully open position according to an embodiment.
Figure 26:
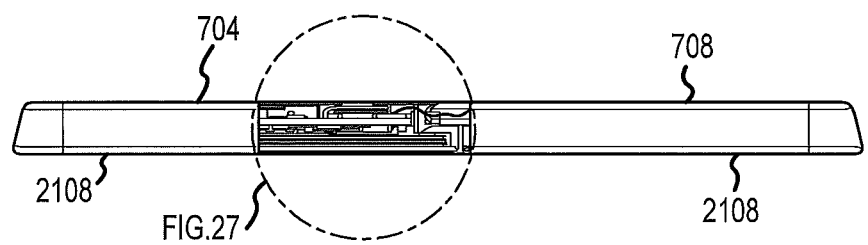
FIG. 26 is a partial side cross-sectional view of the device according to an embodiment.
Figure 27:
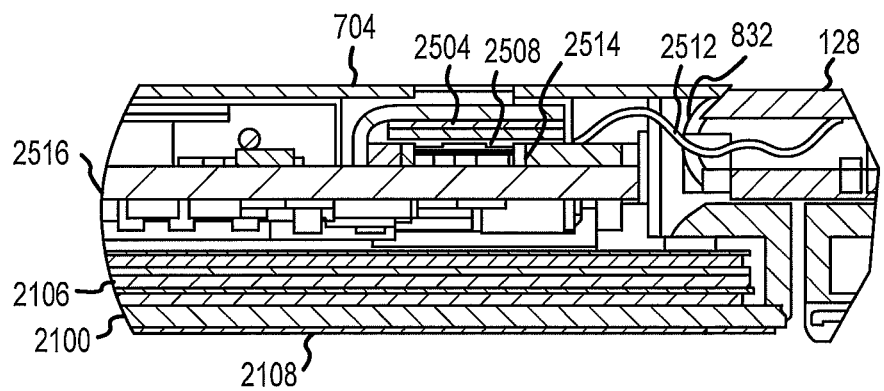
FIG. 27 is an enlarged view of the cross-sectional detail of FIG. 26.

FIGS. 25-27 depict a flexible circuit connector securing assembly 2500. The securing assembly 2500 includes a bracket 2504 and resilient gasket 2508, located between the bracket 2504 and a connector 2514 on the printed circuit board 2516, to apply pressure, typically of at least about 50 psi, more typically of at least about 100 psi, and even more typically of at least about 150 psi but typically no more than about psi, to a flexible circuit 2512, thereby maintaining the electrical connection with the connector 2514, typically for greater than 100,000 cycles. The securing assembly 2500 uses screws 2530, passing through the printed circuit board 2516, to mount the securing assembly 2500 to the corresponding one of the first and second housing 704 and 708 and to apply the pressure to the flexible circuit.

FIGS. 24, 28A-D, and 29A-B depict substantially transparent light guides and a substantially opaque light guide support bracket for illuminating the areas 112*a-c* (FIG. 1A). As can be seen in FIGS. 29A-B, the light guides 2900*a-c* each include a substantially planar upper surface 2904 and a smooth and concave (e.g., parabolic-shaped) lower surface 2908 to receive incident light from a light source, such as an LED lamp, on the printed circuit board 2516 and direct the light into a collimated or converging beam towards the upper surface 2904. The light guides are positioned beneath a corresponding area 112*a-c* in the respective display panel 2108 for illumination. The support bracket 2800 comprises a first, second, and third light guide receptacles 2804*a-c* to receive the light guides 2900*a-c*, a stepped peripheral edge 2808 to engage a similarly shaped inner edge 920 of the corresponding first or second housing 704 and 708, and fastener holes 2812, which align with holes 924 in the corresponding housing to receive a fastener, such as a screw, to attach securely the support bracket 2800 to the housing. When engaged, the light guides and support bracket define a substantially planar upper surface 2816 to engage the lower surface of the display panel.

The light guides 2900 can be discrete from or integrated with the support bracket 2800. Integration is effected using a multi-step molding process. In a first step, a substantially opaque resin is molded into a predefined shape including the light guide receptacles 2804*a*-*c*, each having a shape mating the outer surface of the corresponding light guide. In a second step, the substantially transparent, or light transmissive, resin, such as an acrylic resin, polycarbonate, epoxy, or glass, is injected into the light guide receptacles to form the unitary light guide assembly of FIGS. 28A-D. When the light guides 2900 are discrete from the support bracket, they are engaged with the support bracket using a suitable adhesive, a friction fit, or other form of mechanical engagement. In other embodiments, the light guides and support bracket are in multiple interlocking pieces. At any one time, the set of light guides is illuminated of whichever of the first and second screens is currently in focus. As will be appreciated, the light guides can be made in any desired shape, such as cylindrical, oval, rectangular, conical, or other shape (e.g., arrow, star shaped, and quarter moon shaped).

Figure 30C:
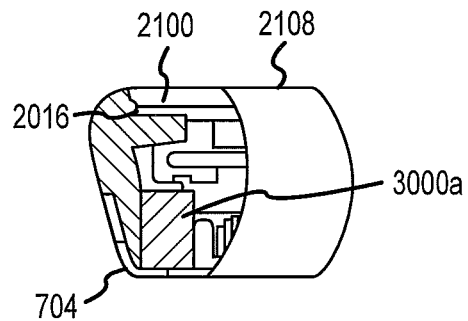
FIG. 30C is an enlarged view of a sectional view of FIG. 30B.
Figure 30D:
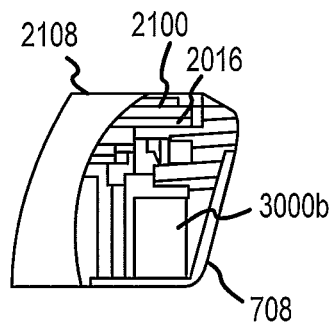
FIG. 30D is an enlarged view of a sectional view of FIG. 30B.
Figure 30E:
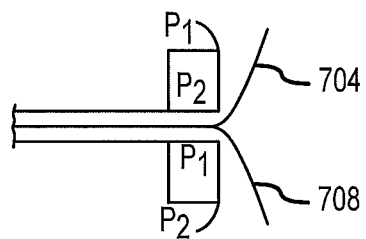
FIG. 30E depicts the sectional views of FIG. 30B when the device is in the fully closed position.
Figure 31C:
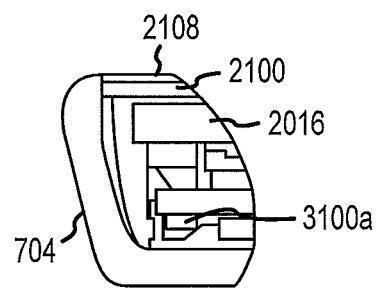
FIG. 31C is an enlarged view of a sectional view of FIG. 31B.
Figure 31D:
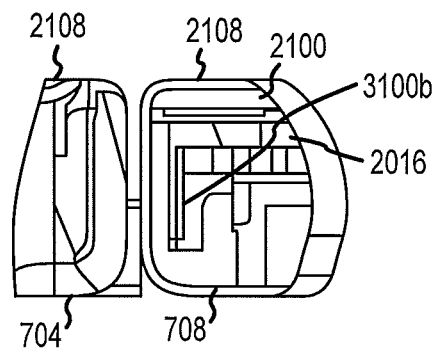
FIG. 31D is an enlarged view of a sectional view of FIG. 31B.

FIGS. 30A-D depict a non-mechanical closure mechanism for the device 100. As will be appreciated, a common mechanism for locking dual screen cellular phones in a closed orientation is to lock the opposing screens mechanically in position. The mechanical locking mechanism has sufficient force to resist hinges exerting an opposing spring-back force. Mechanical locking mechanisms can malfunction, especially after repeated usage, in response to breakage or other failure of the locking mechanism components. As shown in FIGS. 30A-D, a non-mechanical closure mechanism can include first and second magnets 3000*a*-*b* positioned respectively on the first and second screens 104 and 108 such that the first and second magnets exert a magnetically attractive force on one another when the first and second screens 104 and 108 are in the closed position and substantially no magnetically attractive force on one another when the first and second screens 104 and 108 are in any of the fully open, easel, or modified easel positions. To provide the magnetic force of attraction, the first and second magnets 3000*a,b* are positioned such that opposing poles $P_1$ (e.g., N or S) and $P_2$ (e.g., the other of N or S) are adjacent to one another (FIG. 30E) when the first and second screens 104 and 108 are in the fully closed position. To protect the display panel 2108 from the magnetic field of the first and second magnets 3000*a, b*, the first and second magnets 3000*a,b* are positioned on opposing sides of the display frame 2100 from the display panel 2108. The use of the first and second magnets 3000*a,b* as a closure mechanism can avoid the problems commonly encountered with mechanical locking mechanisms. In other configurations, one of the first and second magnets is replaced by an iron-containing magnetic material. More than two magnets can be employed. The first and second magnets can be sized, positioned, and shaped to avoid interference with any of the other electronic components of the device 100.

FIGS. 31A-D depict a particular configuration of the position sensor(s) 172. The position sensor(s) 172 include first and second Hall-Effect sensors 3100*a,b* positioned, respectively, adjacent to the first screen 104 and first housing 704 and to the second screen 108 and second housing 708. The first Hall-Effect sensor 3100*a* is positioned proximal to a distal corner 3104 of the first housing 704 and screen 104 while the second Hall-Effect sensor 3100*b* is positioned at a location 3108 proximal to the hinge 128, with the first and second Hall-Effect sensors 3100*a,b* being positioned on opposing sides of the hinge 128. With reference to FIG. 31, the first Hall-Effect sensor 3100*a* is positioned on an opposing side of the frame 2100 from the display panel 2108 and near the base of the first housing 704. In contrast, the second Hall-Effect sensor 3100*b* is positioned on an opposing side of the frame 2100 from the display panel 2108 and near the base of the second housing 708.

In operation, the first and second Hall-Effect sensors 3100*a,b* sense the strength of an applied magnetic field by measuring the Hall voltage across opposing faces of the sensor. While not wishing to be bound by any theory, an electric current is passed through the sensor, which current will produce a corresponding magnetic field. Applied magnetic field(s) cause the electrons in the current to deflect into a curved path as the electrons move through the sensor material due to the interaction of the magnetic fields. This interaction is known as the Lorentz force. Consequently, one side of the sensor material will pass more electrons than the other. The resulting potential difference (voltage) appears across the material at right angles to both the magnetic fields from the permanent magnet and the flow of current. This is known as the Hall effect. In other words, the Hall voltage is directly proportional in size to both the electric current and the magnetic field. As the relative positions of the first and second screens 104 and 108 change, the magnitude of the cumulative magnetic field applied to each of the first and second Hall-Effect sensors also changes. The applied magnetic field is caused by the first and second magnets 3000*a,b* and electrical current passing through other electrical components adjacent to the first and second screens 104 and 108 of the device 100, such as the printed circuit board, flexible circuits, antenna, GPS, microphone, speaker, and camera. A look up table mapping the measured Hall voltage for each of the first and second Hall-Effect sensors 3100*a,b* against first and second screen position can be used to determine the relative positions of the first and second screens 104 and 108.

The exemplary systems and methods of this disclosure have been described in relation to mechanical features of a multi-screen device. However, to avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a Personal Computer (PC), laptop, netbook, Personal Digital Assistant (PDA), tablet, etc., or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In some embodiments, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, sub-combinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A handheld computing device, comprising:
    a first screen having a front surface, a rear surface, and a side surface extending between a periphery of the front and rear surfaces of the first screen;
    a second screen having a front surface, a rear surface, and a side surface extending between a periphery of the front and rear surfaces of the second screen; and
    a hinge connected to the first screen so that the first screen is rotatable about a first pivot axis, the hinge connected to the second screen so that the second screen is rotatable about a second pivot axis, wherein the hinge is configured to permit the first and second screens to be rotatable from a closed position in which the rear surfaces of the first and second screens are substantially in contact with each other to a fully open position in which the front surfaces of the first and second screens are rotated beyond a planar configuration, in which the front surfaces of the first and second screens are substantially coplanar, to a non-planar configuration, in which the front surfaces of the first and second screens are transverse to each other, wherein the hinge further comprises a hub and first and second leaves, wherein the planes of the front surfaces of the first and second screens are substantially transverse to each other in the fully open position, and wherein, when in the fully open position, an angle δ defined between the rear surface of each of the first and second leaves and a horizontal plane is no more than 10°.

2. The device of claim 1, wherein the hinge has a range of motion of at least about 180 degrees so that the device is foldable between a partially open position in which the first and second screens are juxtaposed in substantially the same plane and the closed position in which the first and second screens are oriented substantially back-to-back in adjacent planes, wherein the front surfaces of the first and second screens each include a display area, and wherein, when the hinge is in the closed position, the display areas face in opposing directions.

3. The device of claim 1, wherein the hinge is one of a barrel hinge, pivot hinge, butt/mortise hinge, case hinge, continuous or piano hinge, concealed hinge, butterfly hinge, flag hinge, strap hinge, H hinge, HL hinge, counterflap hinge, flush hinge, coach hinge, rising butt hinge, double action spring hinge, Tee hinge, fraction hinge, security hinge, cranked hinge, lift-off hinge, self-closing hinge, butt hinge, butler tray hinge, card table hinge, and drop leaf table hinge and wherein, when the first and second screens are in the fully open position, the front surface of the first screen is positioned adjacent to an opposing edge of the second screen in a substantially abutting relationship to substantially close any gap between the first and second screens.

4. The device of claim 3, wherein the side surfaces of each of the first and second screens each comprise an opening, wherein the hinge is at least partially disposed within the openings of the first and second screens, wherein a hub of the hinge includes an internal passage extending between the openings of the first and second screens, the internal passage passing a flexible circuit, and wherein, when in the fully open position, the angle δ defined between the rear surface of each of the first and second leaves and a horizontal plane is no more than about 5°.

5. The device of claim 3, wherein the first leaf is rotatably connected to the hub about the first pivot axis, wherein the second leaf is rotatably connected to the hub about the second pivot axis, wherein the first leaf is connected to the first screen, wherein the second leaf is connected to the second screen, and wherein, when in the fully open position, the angle δ defined between the rear surface of each of the first and second leaves and a horizontal plane is no more than about 5°.

6. The device of claim 1, wherein, when the device is in the fully open position, the openings of the first and second screens substantially oppose each other, wherein, when the first and second screens are in the fully open position, the front surface of the first screen is positioned adjacent to an opposing edge of the second screen in a substantially abutting relationship to substantially close any gap between the first and second screens, and wherein the gap is no more than 10 mm.

7. The device of claim 6, wherein, when the device is in the fully open position, the hinge is substantially disposed within an outer envelope of the device and wherein the gap is no more than 5 mm.

8. The device of claim 7, wherein, when the device is in the fully open position, the hinge is substantially flush with the rear surfaces of the first and second screens and wherein the gap is no more than 1 mm.

9. The device of claim 7, wherein, when the device is in the closed position, the hinge is substantially disposed within an outer envelope of the device and wherein the gap is no more than 0.5 mm.

10. The device of claim 9, wherein. when the device is in the closed position, the hinge is substantially flush with the side surfaces of the first and second screens and wherein the gap is no more than 0.25 mm.

11. A hinge configured for use in a handheld computing device, comprising:
    an elongate hub;
    a first leaf rotatably connected to the elongate hub about a first pivot axis; and
    a second leaf rotatably connected to the elongate hub about a second pivot axis, wherein the first and second pivot axes are substantially parallel, wherein the hinge is configured to permit first and second screens of a computing device, each of the first and second screens comprising a front surface, a rear surface, and a side surface extending between a periphery of the front and rear surfaces, to be rotatable from a closed position in which the rear surfaces of the first and second screens are substantially in contact with each other to a fully open position in which the front surfaces of the first and second screens are rotated beyond a planar configuration, in which the front surfaces of the first and second screens are substantially coplanar, to a nonplanar
    configuration, in which the front surfaces of the first and second screens are transverse to each other, wherein the planes of the front surfaces of the first and second screens are substantially transverse to each other in the fully open position, and wherein, when in the fully open position, an angle δ defined between the rear surface of each of the first and second leaves and a horizontal plane is no more than 10°.

12. The hinge of claim 11, wherein the elongate hub includes at least one internal passage extending transversely to the first and second pivot axes, the internal passage passing a flexible circuit and wherein, when the first and second screens are in the fully open position, the front surface of the first screen is positioned adjacent to an opposing edge of the second screen in a substantially abutting relationship to substantially close any gap between the first and second screens.

13. The hinge of claim 12, wherein the hinge is one of a barrel hinge, pivot hinge, butt/mortise hinge, case hinge, continuous or piano hinge, concealed hinge, butterfly hinge, flag hinge, strap hinge, H hinge, HL hinge, counterflap hinge, flush hinge, coach hinge, rising butt hinge, double action spring hinge, Tee hinge, fraction hinge, security hinge, cranked hinge, lift-off hinge, self-closing hinge, butt hinge, butler tray hinge, card table hinge, and drop leaf table hinge and wherein, when in the fully open position, the angle δ defined between the rear surface of each of the first and second leaves and a horizontal plane is no more than 5°.

14. The hinge of claim 11, wherein the first and second leaves each have a range of motion of at least about 90 degrees between a fully open position and a closed position and wherein, when in the fully open position, an the angle δ defined between the rear surface of each of the first and second leaves and a horizontal plane is no more than 5°.

15. A method of assembling a handheld computing device, the method comprising:
providing:
a first screen having a front surface, a rear surface, and a side surface extending between a periphery of the front and rear surfaces of the first screen, wherein the side surface of the first screen includes an opening;
a second screen having a front surface, a rear surface, and a side surface extending between a periphery of the front and rear surfaces of the second screen, wherein the side surface of the second screen includes an opening; and
a hinge having a first pivot axis and a second pivot axis and a hub and first and second leaves;
positioning the hinge at least partially within the opening of the first screen;
positioning the hinge at least partially within the opening of the second screen;
connecting the hinge to the first screen so that the first screen is rotatable about the first pivot axis; and
connecting the hinge to the second screen so that the second screen is rotatable about the second pivot axis, wherein, when connected to the first and second screens, the hinge is configured to permit the first and second screens to be rotatable from a closed position in which the rear surfaces of the first and second screens are substantially in contact with each other to a fully open position in which the front surfaces of the first and second screens are rotated beyond a planar configuration, the planar configuration being a configuration, in which the front surfaces of the first and second screens are substantially coplanar, to a non-planar configuration, in which the front surfaces of the first and second screens are transverse to each other, wherein the planes of the front surfaces of the first and second screens are substantially transverse to each other in the fully open position, and wherein, when in the fully open position, an angle δ defined between the rear surface of each of the first and second leaves and a horizontal plane is no more than 10°.

16. The method of claim 15, wherein the hinge is one of a barrel hinge, pivot hinge, butt/mortise hinge, case hinge, continuous or piano hinge, concealed hinge, butterfly hinge, flag hinge, strap hinge, H hinge, HL hinge, counterflap hinge, flush hinge, coach hinge, rising butt hinge, double action spring hinge, Tee hinge, fraction hinge, security hinge, cranked hinge, lift-off hinge, self-closing hinge, butt hinge, butler tray hinge, card table hinge, and drop leaf table hinge and wherein, when the first and second screens are in the fully open position, the front surface of the first screen is positioned adjacent to an opposing edge of the second screen in a substantially abutting relationship to substantially close any gap between the first and second screens.

17. The method of claim 16, wherein the hub includes an internal passage extending between the openings of the first and second screens, the internal passage passing a flexible circuit, and wherein, when in the fully open position, the angle δ defined between the rear surface of each of the first and second leaves and a horizontal plane is no more than 5°.

18. The method of claim 16, wherein the first leaf is rotatably connected to the hub about the first pivot axis, wherein the second leaf is rotatably connected to the hub about the second pivot axis, wherein the first leaf is connected to the first screen, wherein the second leaf is connected to the second screen, and wherein, when in the fully open position, the δ defined between the rear surface of each of the first and second leaves and a horizontal plane is no more than 5°.

19. The method of claim 15, wherein when the device is in the fully open position, the openings of the first and second screens substantially oppose each other, wherein, when the first and second screens are in the fully open position, the front surface of the first screen is positioned adjacent to an opposing edge of the second screen in a substantially abutting relationship to substantially close any gap between the first and second screens, and wherein the gap is no more than 10 mm.

20. The method of claim 19, wherein when the device is in the fully open position, the hinge is substantially disposed within an outer envelope of the device, and wherein the gap is no more than 5 mm.

21. The method of claim 20, wherein when the device is in the fully open position, the hinge is substantially flush with the rear surfaces of the first and second screens and wherein the gap is no more than 1 mm.

22. The method of claim 20, wherein when the device is in the closed position, the hinge is substantially disposed within an outer envelope of the device and wherein the gap is no more than 0.5 mm.

23. The method of claim 22, wherein when the device is in the closed position, the hinge is substantially flush with the side surfaces of the first and second screens and wherein the gap is no more than 0.25 mm.

24. A method for using a handheld computing device, comprising:
providing a handheld computing device comprising: a first screen having a front surface, a rear surface, and a side surface extending between a periphery of the front and rear surfaces of the first screen, a second screen having a front surface, a rear surface, and a side surface extending between a periphery of the front and rear surfaces of the second screen, and a hinge rotatably connecting the first and second screens, wherein the hinge is configured to permit the first and second screens to be rotatable from a closed position in which the rear surfaces of the first and second screens are substantially in contact with each other to a fully open position in which the front surfaces of the first and second screens are rotated beyond a planar configuration, in which the front surfaces of the first and second screens are substantially coplanar, to a non-planar configuration, in which the front surfaces of the first and second screens are transverse to each other, wherein the hinge further comprises a hub and first and second leaves, wherein the planes of the front surfaces of the first and second screens are substantially transverse to each other in the fully open position, and wherein, when in the fully open position, an angle δ defined between the rear surface of each of the first and second leaves and a horizontal plane is no more than 10°.

25. The method of claim 24, wherein the hinge has a range of motion of more than 180 degrees so that the device is foldable between a partially open position in which the first and second screens are juxtaposed in substantially the same plane and the closed position in which the first and second screens are oriented substantially back-to-back in adjacent planes, wherein the front surfaces of the first and second screens each include a display area, and wherein, when the hinge is in the closed position, the display areas face in opposing directions.

26. The method of claim 24, wherein the hinge is one of a barrel hinge, pivot hinge, butt/mortise hinge, case hinge, continuous or piano hinge, concealed hinge, butterfly hinge, flag hinge, strap hinge, H hinge, HL hinge, counterflap hinge, flush hinge, coach hinge, rising butt hinge, double action spring hinge, Tee hinge, fraction hinge, security hinge, cranked hinge, lift-off hinge, self-closing hinge, butt hinge, butler tray hinge, card table hinge, and drop leaf table hinge and wherein, when the first and second screens are in the fully open position, the front surface of the first screen is positioned adjacent to an opposing edge of the second screen in a substantially abutting relationship to substantially close any gap between the first and second screens.

27. The method of claim 26, wherein the first screen is rotatable about a first pivot axis and the second screen is rotatable about a second pivot axis, wherein the side surfaces of each of the first and second screens each comprise an opening, wherein the hinge is at least partially disposed within the openings of the first and second screens, wherein a hub of the hinge includes an internal passage extending between the openings of the first and second screens, the internal passage passing a flexible circuit, wherein the planes of the front surfaces of the first and second screens are substantially transverse to each other in the fully open position, and wherein, when in the fully open position, the angle $\delta$ defined between the rear surface of each of the first and second leaves and a horizontal plane is no more than 5°.

* * * * *

UNITED STATES PATENT AND TRADEMARK OFFICE
CERTIFICATE OF CORRECTION

PATENT NO. : 9,013,867 B2
APPLICATION NO. : 13/627816
DATED : April 21, 2015
INVENTOR(S) : Charles Becze and Michael J. O'Connor It is certified that error appears in the above-identified patent and that said Letters Patent is hereby corrected as shown below:

Claims

At Column 45, line 62, claim 4, please delete the word "about" therein.

At Column 46, line 4, claim 5, please delete the word "about" therein.

At Column 47, line 12, claim 14, please delete the second occurrence of "the" therein.

Signed and Sealed this
First Day of March, 2016

Michelle K. Lee
*Director of the United States Patent and Trademark Office*